(12) United States Patent
Perry et al.

(10) Patent No.: US 11,175,244 B2
(45) Date of Patent: Nov. 16, 2021

(54) GRAPHENE-BASED ELECTRO-MICROFLUIDIC DEVICES AND METHODS FOR PROTEIN STRUCTURAL ANALYSIS

(71) Applicant: University of Massachusetts, Boston, MA (US)

(72) Inventors: Sarah L. Perry, Belchertown, MA (US); Shou Sui, Amherst, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 16/444,240

(22) Filed: Jun. 18, 2019

(65) Prior Publication Data

US 2019/0383764 A1    Dec. 19, 2019

Related U.S. Application Data

(60) Provisional application No. 62/687,190, filed on Jun. 19, 2018.

(51) Int. Cl.
*G01N 23/20*        (2018.01)
*G01N 23/20008*     (2018.01)
(Continued)

(52) U.S. Cl.
CPC ..... *G01N 23/20025* (2013.01); *B01D 9/0072* (2013.01); *B01L 3/06* (2013.01); *B01L 3/502707* (2013.01); *B01L 3/502761* (2013.01); *C30B 7/14* (2013.01); *G01N 23/20* (2013.01); *G01N 23/201* (2013.01);
(Continued)

(58) Field of Classification Search
CPC ............ G01N 23/20; G01N 23/20008; G01N 23/20025; G01N 23/20066; G01N 23/20083; G01N 23/20091; G01N 23/201; G01N 23/203; G01N 23/205; G01N 23/207; G01N 23/2076; G01N 23/22; G01N 23/2202; G01N 23/2204; G01N 23/2206;
(Continued)

(56) References Cited

U.S. PATENT DOCUMENTS 9,274,059 B2 *  3/2016  Yu ...................... G01N 23/2204
9,659,734 B2 *  5/2017  Duncan ................... H01J 3/021
(Continued)

OTHER PUBLICATIONS

Shuo Sui et al., Graphene-based microfluidics for serial crystallography, Lab Chip 2016, 16, 3082-3096.*
(Continued)

*Primary Examiner* — Allen C. Ho
(74) *Attorney, Agent, or Firm* — Milstein Zhang & Wu LLC

(57) ABSTRACT

The invention provides a novel microfluidic platform for use in electro-crystallization and electro-crystallography experiments. The manufacturing and use of graphene as X-ray compatible electrodes allows the application of electric fields on-chip, during X-ray analysis. The presence of such electric fields can be used to modulate the structure of protein (or other) molecules in crystalline (for X-ray diffraction) or solution form (for X-ray scattering). Additionally, the presence of an electric field can be used to extend the lifetime of fragile samples by expediting the removal of reactive secondary radiation damage species.

20 Claims, 20 Drawing Sheets

(51) Int. Cl.

| | |
|---|---|
| G01N 23/20025 | (2018.01) |
| G01N 23/20066 | (2018.01) |
| G01N 23/20091 | (2018.01) |
| G01N 23/201 | (2018.01) |
| G01N 23/205 | (2018.01) |
| G01N 23/207 | (2018.01) |
| B01L 3/00 | (2006.01) |
| C30B 7/14 | (2006.01) |
| B01L 3/06 | (2006.01) |
| B01D 9/00 | (2006.01) |
| G01N 27/26 | (2006.01) |
| G01N 23/2209 | (2018.01) |
| G01N 23/223 | (2006.01) |
| G01N 23/2204 | (2018.01) |
| G01N 23/203 | (2006.01) |
| G01N 23/22 | (2018.01) |
| G01N 23/2202 | (2018.01) |
| G01N 23/2206 | (2018.01) |
| G01N 23/2208 | (2018.01) |

(52) U.S. Cl.
CPC ......... *G01N 23/203* (2013.01); *G01N 23/205* (2013.01); *G01N 23/207* (2013.01); *G01N 23/20008* (2013.01); *G01N 23/20066* (2013.01); *G01N 23/2076* (2013.01); *G01N 23/20083* (2013.01); *G01N 23/20091* (2013.01); *G01N 23/22* (2013.01); *G01N 23/2202* (2013.01); *G01N 23/223* (2013.01); *G01N 23/2204* (2013.01); *G01N 23/2206* (2013.01); *G01N 23/2208* (2013.01); *G01N 23/2209* (2018.02); *G01N 27/26* (2013.01); *B01L 2200/10* (2013.01)

(58) Field of Classification Search
CPC ........... G01N 23/2208; G01N 23/2209; G01N 23/223
USPC .............................. 378/70–90, 208
See application file for complete search history.

(56) References Cited

U.S. PATENT DOCUMENTS

| | | | | |
|---|---|---|---|---|
| 9,778,213 | B2* | 10/2017 | Bakeman | G01N 23/223 |
| 10,365,188 | B2* | 7/2019 | Fraden | G01N 23/20025 |
| 10,792,657 | B2* | 10/2020 | Sui | B01L 3/06 |
| 10,801,975 | B2* | 10/2020 | Bakeman | G01N 23/201 |

OTHER PUBLICATIONS

Sarah L. Perry et al., A microfluidic approach for protein structure determination at room temperature via on-chip anomalous diffraction, Lab Chip 2013, 13, 3183-3187.*

* cited by examiner (a)

(b)

Three potential architectures

Device setups

Three architectures

Device setups

GRAPHENE-BASED ELECTRO-MICROFLUIDIC DEVICES AND METHODS FOR PROTEIN STRUCTURAL ANALYSIS

PRIORITY CLAIMS AND RELATED PATENT APPLICATIONS

This application claims the benefit of priority to U.S. Provisional Application Ser. No. 62/687,190, filed on Jun. 19, 2018, the entire content of which is incorporated herein by reference in its entirety.

STATEMENT REGARDING FEDERALLY FUNDED RESEARCH OR DEVELOPMENT

This invention was made with government support under Grant No. NSF-1231306 awarded by the National Science Foundation. The Government has certain rights in the invention.

TECHNICAL FIELD OF THE INVENTION

The invention generally relates to microfluidic devices and X-ray analysis. More particularly, the invention relates to electro-microfluidic devices that utilize graphene films as architectural materials and methods of fabrication and use thereof in X-ray analysis of target materials (e.g., biomolecules).

BACKGROUND OF THE INVENTION

Microfluidic and microscale devices have a demonstrated potential to enable both protein crystallization and in situ X-ray diffraction. Such platforms have been increasingly harnessed to facilitate the diffraction analysis of challenging targets for both static and dynamic structure determination. Various platforms have been developed to improve the growth and subsequent mounting of tiny and fragile crystals for X-ray diffraction analysis, including dense array-style devices, platforms for the lipidic cubic phase crystallization of membrane proteins, and thin-film sandwich devices. (Sui, et al. *Structural Dynamics* 2017, 4, 032202; Ghazal, et al. *Lab Chip* 2016, 16, 4263-4295; Sauter, et al. *Cryst. Growth Des.* 2007, 7, 2247-2250; Chavas, et al. *Structural Dynamics* 2015, 2, 041709; Weierstall, et al. *Philos. Trans. R. Soc., B* 2014, 369, 20130337; Guha, et al. *Sens. Actuators, B* 2012, 174, 1-9; Perry, et al. *Lab Chip* 2013, 13, 3183-3187; Heymann, et al. *IUCrJ* 2014, 1, 349-360; Kisselman, et al. *Acta Crystallogr., Sect. D: Biol. Crystallogr.* 2011, 67, 533-539; Chirgadze, et al. In *Recent Advances in Crystallography*; Benedict, J. B., Ed.; InTech, 2012; pp. 87-96; Hunter, et al. *Scientific Reports* 2014, 4, 6026; Feld, et al. *J. Appl. Cryst.* 2015, 48, 1072-1079; Baxter, et al. *Acta Crystallogr., Sect. D: Biol. Crystallogr.* 2016, 72, 2-11; Lyubimov, et al. *Acta Crystallogr., Sect. D: Biol. Crystallogr.* 2015, 71, 928-940; Roedig, et al. *Scientific Reports* 2015, 5, 10451; Dhouib, et al. *Lab Chip* 2009, 9, 1412-1421; Pinker, et al. *Cryst. Growth Des.* 2013, 13, 3333-3340; Emamzadah, et al. *Acta Crystallogr., Sect. D: Biol. Crystallogr.* 2009, 65, 913-920; Huang, et al. *Acta Crystallogr., Sect. D: Biol. Crystallogr.* 2016, 72, 93-112; Huang, et al. *Acta Crystallogr., Sect. D: Biol. Crystallogr.* 2015, 71, 1238-1256; Axford, et al. *Acta Crystallogr., Sect. F: Struct. Biol. Commun.* 2016, 313-319.)

In the meantime, the challenges of such platforms lie in the need to maintain a protected sample environment as well as to minimize the interference of device materials with the subsequent X-ray analysis. To address these two issues, a microfluidic device architecture was recently developed to take advantage of large-area sheets of graphene. (Sui, et al. *Lab Chip* 2016, 16, 3082-3096.)

The brilliance of X-ray free-electron lasers (XFELs) has created a revolution in the field of structural biology. While traditional methods of single-crystal cryocrystallography will continue to serve as the workhorse method for structure determination for the foreseeable future, XFELs and the types of serial analysis methods derived from XFEL work have the potential to enable a new generation of experiments that focus on directly characterizing protein structural dynamics. (Smith, et al. *Curr. Opin. Struct. Biol.* 2012, 22, 602-612; Holton, et al. *Acta Crystallogr., Sect. D: Biol. Crystallogr.* 2010, 66, 393-408)

These largescale serial methods, however, suffer from the need to grow and manipulate a large number of high quality crystals. These issues are then further compounded by the need to deliver such samples efficiently to the X-ray beam and the challenge of synchronizing structural dynamics within crystals. Microfluidic and microscale technologies have played a critical role in facilitating protein crystallization and structure determination, with the breadth and variety of reported solutions demonstrating the challenging nature of the field. Successful sample delivery methods for serial crystallography at both XFEL and synchrotron sources have utilized both fixed-target and injector technologies, including for time-resolved experiments. (Roedig, et al. *Scientific Reports* 2015, 5, 10451; Suga, et al. *Nature* 2015, 517, 99-103; Guha, et al. *Sens. Actuators, B* 2012, 174, 1-9; Perry, et al. *Lab Chip* 2013, 13, 3183-3187; Clemons, et al. *J. Mol. Biol.* 2001, 310, 827-843; Harms, et al. *Structure* 1999, 7, 931-941; Sui, et al. *Structural Dynamics* 2017, 4(3):032202.)

A fixed-target approach was recently reported that takes advantage of large-area sheets of graphene to facilitate fixed-target X-ray diffraction analysis with ultra-low background noise and a sample environment that is stable against significant water loss over several weeks. (Sui, et al. *Lab Chip* 2016, 16, 3082-3096.)

While the field of injector technologies continues to rapidly develop, there is a pressing need for more robust fixed-target sample mounting strategies that provide excellent signal-to-noise while maintaining sample stability. Major challenges remain in microfluidic X-ray analysis and protein crystallography. For example, novel devices and methods for robust, high-throughput serial crystallography at both XFELs and synchrotrons are desired.

SUMMARY OF THE INVENTION

The invention provides a novel microfluidic platform for electro-crystallization and electro-crystallography. The disclosed device incorporates ultra-thin graphene-based films as electrodes and as X-ray transparent windows to enable in situ X-ray diffraction analysis. A core feature of the invention is that it harnesses the intrinsic conductivity of graphene to enable electro-crystallization experiments in the precisely-controlled microfluidic geometry of the disclosed device, along with in situ X-ray analysis of the resulting crystals. Additionally, it is possible to perform in situ X-ray analysis of the crystals under the application of an electric field. Thus, the devices and methods of the invention afford faster nucleation and crystal growth, as well as higher signal-to-noise for diffraction data obtained from crystals prepared in the presence of an applied electric field, and can be used to examine the effect of an electric field on the structure and/or structural dynamics of the crystal.

In one aspect, the invention generally relates to an electro-microfluidic device, comprising: a top layer comprising a top support layer and one or more top layer(s) of graphene, wherein the top layer exhibits an optically clear top window area; a bottom layer comprising a bottom support layer and one or more bottom layer(s) of graphene, wherein the bottom layer exhibits an optically clear bottom window area; a middle layer sandwiched between the top layer and the bottom layer having a patterned cavity defining a sample holding chamber; a cathode electrically connected to the proximal portion of one or more layer(s) of graphene on top and/or bottom; and an anode electrically connected to the distal portion of one or more layer(s) of graphene on top and/or bottom configured to allow application of an electric field within or across the microfluidic device. The top window area is comprised of at least a portion of the top layer(s) of graphene, and the bottom window area is comprised of at least a portion of the bottom layer(s) of graphene.

In another aspect, the invention generally relates to an array device (or device array or network) having two or more microfluidic devices according to the invention.

In yet another aspect, the invention generally relates to a method for fabricating an electro-microfluidic device, comprising: providing a first graphene film comprising one or more layer(s) of graphene and a second graphene film comprising one or more layer(s) of graphene; transferring the first graphene film to a support layer forming a top layer with a window area defined by the first graphene film; transferring the second graphene film to a support layer forming a bottom layer with a window area defined by the second graphene film; forming the microfluidic device by bonding a middle layer to and between the top and the bottom layers to form a sandwiched construct having a cavity for holding a sample defined by the top and bottom layers and the pattern of the middle layer, and a first and second channels connecting to the second graphene film at a proximal and a distal location; and providing a conductive material (e.g., a liquid alloy, solder, conductive epoxy) to the first and second channels so as to form electric connectivity to the second graphene film.

In yet another aspect, the invention generally relates to an electro-microfluidic device fabricated by a method disclosed herein.

In yet another aspect, the invention generally relates to a method for growing crystalline or non-crystalline materials, comprising: growing one or more crystalline or non-crystalline materials in the sample chamber of an electro-microfluidic device disclosed herein under a controlled application of an electric field.

In yet another aspect, the invention generally relates to a method of electro-crystallization and X-ray scattering or diffraction analysis, comprising: growing one or more crystalline or non-crystalline materials in the sample chamber of an electro-microfluidic device disclosed herein, optionally under a controlled application of an electric field; directing an X-ray beam to the one or more crystalline or non-crystalline materials via the top or bottom window of the microfluidic device; and measuring the X-ray scattering or diffraction of the one or more crystalline or non-crystalline materials via the bottom or top window of the electro-microfluidic device.

In yet another aspect, the invention generally relates to a method of electro-crystallography, wherein measuring the X-ray scattering or diffraction is conducted with the one or more crystalline or non-crystalline materials being under an electric field (e.g., a static, oscillating or pulsed electric field).

DETAILED DESCRIPTION OF THE INVENTION

The invention provides a novel microfluidic platform for use in electro-crystallization and electro-crystallography experiments. The manufacturing and use of graphene as X-ray compatible electrodes allow the application of electric fields on-chip and during X-ray analysis. The presence of such electric fields can be used to modulate the structure of protein (or other) molecules in crystalline (for X-ray diffraction) or solution form (for X-ray scattering). Additionally, the presence of an electric field can be used to extend the lifetime of fragile samples by expediting the removal of reactive secondary radiation damage species.

The disclosed device incorporates ultra-thin graphene-based films as electrodes and as X-ray transparent windows to enable in situ X-ray diffraction analysis. Furthermore, large area graphene films serve as a gas barrier, creating a stable sample environment over time. Different methods for fabricating graphene electrodes were characterized and electrical capabilities of the devices were validated through the use of methyl viologen, a redox-sensitive dye. Proof-of-concept electro-crystallization experiments using an internal electric field at constant potential were performed using hen egg white lysozyme (HEWL) as a model system. Faster nucleation and crystal growth was observed, as well as higher signal-to-noise for diffraction data obtained from crystals prepared in the presence of an applied electric field. Although this work is focused on the electro-crystallization of proteins for structural biology, this technology is useful in a broad range of both X-ray and other applications of microfluidic technology.

The invention is to harness the intrinsic conductivity of graphene to enable electro-crystallization experiments in the precisely-controlled microfluidic geometry of the device, along with in situ X-ray analysis of the resulting crystals. Previous examples where electricity was applied during protein crystallography experiments involved laborious manipulation of highly fragile samples, large electrodes that are not X-ray compatible, containers with a high X-ray background, and low throughput. The present disclosure allows for the growth and subsequent analysis of large numbers of samples in a high-throughput fashion.

Figure 13:
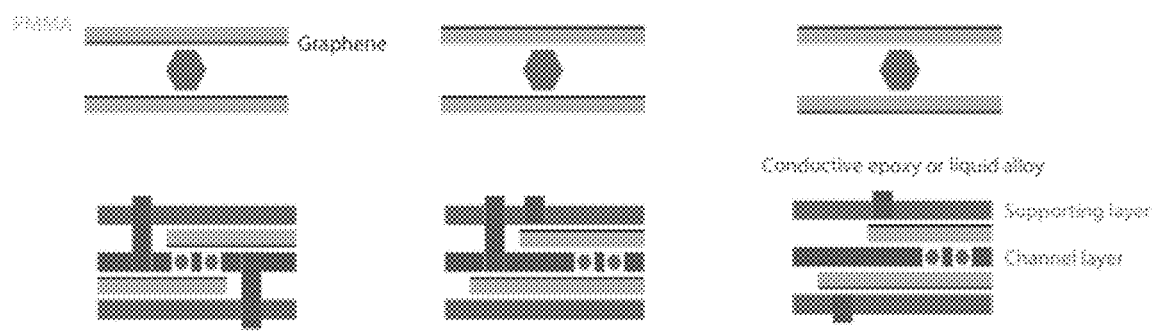
FIG. 13. Schematic depiction of three electrode setups that allow for (left) direct electrode contact to the solution, (middle) a pseudo-capacitive setup with only one electrode in contact with the solution, and (right) a fully capacitive setup where neither electrode contacts the solution.
Figure 13:
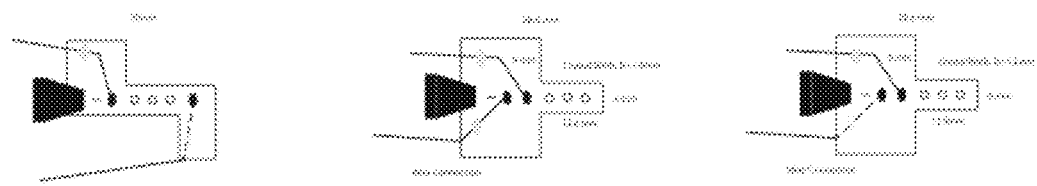
Figure 14:
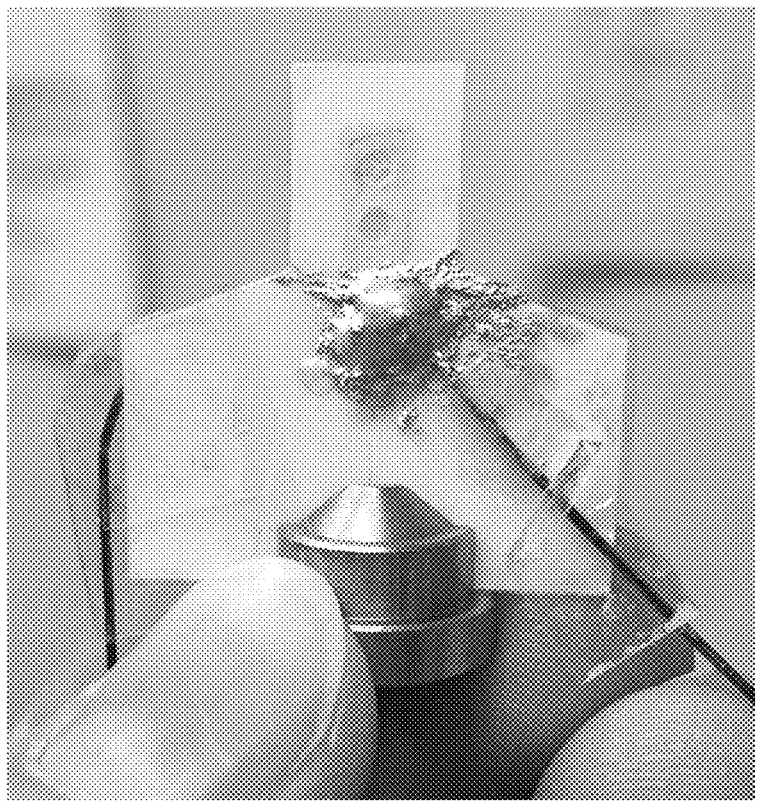
FIG. 14. Photograph of a graphene-based electro-microfluidic device for protein crystallography attached to a standard goniometer base. Wiring was attached via conductive epoxy.
Figure 15:
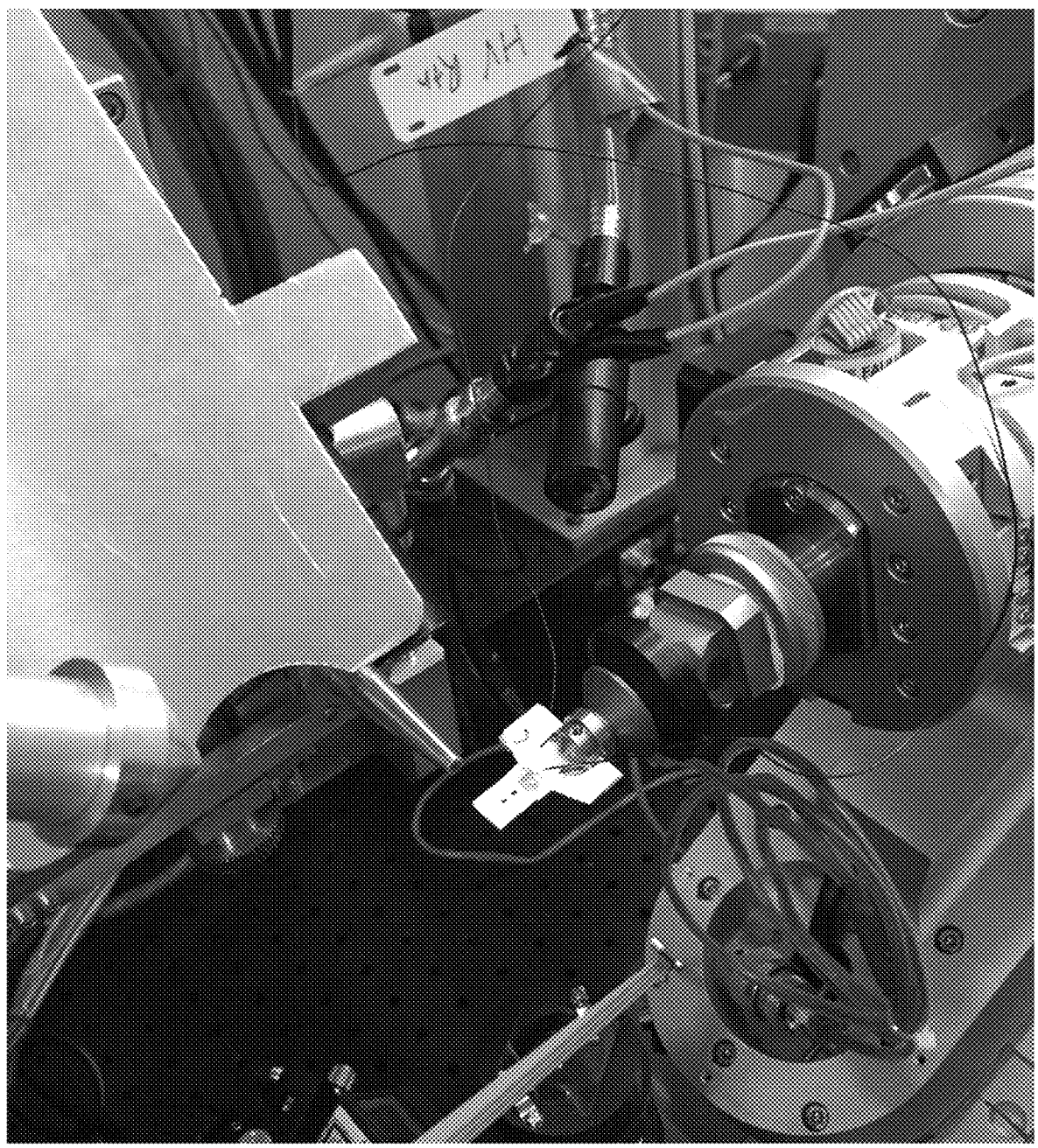
FIG. 15. Photograph of a graphene-based electro-microfluidic device for protein crystallography mounted on beamline 7-1 at Stanford Synchrotron Radiation Lightsource (SSRL).
Figure 16:
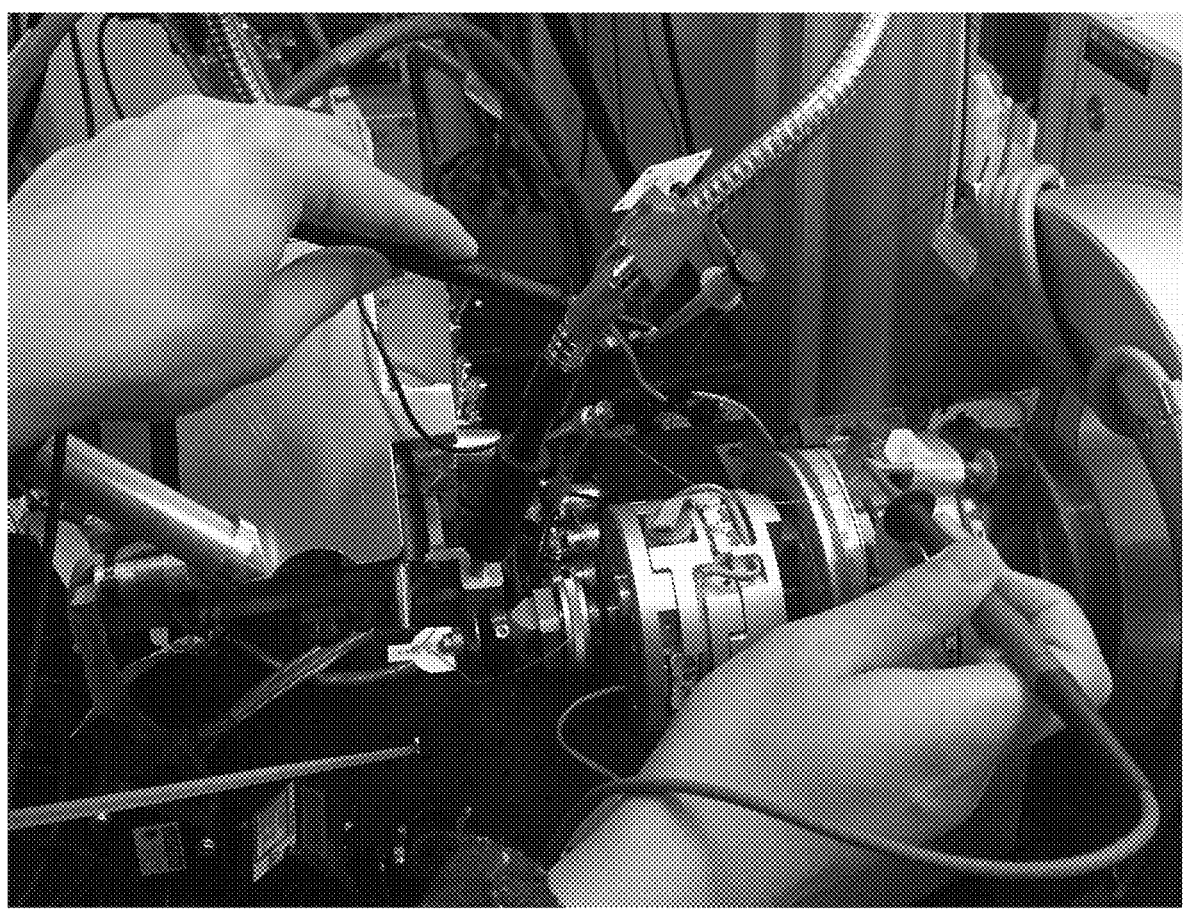
FIG. 16. Photograph showing testing of electrical connections for a graphene-based electro-microfluidic device for protein crystallography mounted on beamline 7-1 at SSRL.

The disclosed fabrication procedures can easily accommodate different electrode configurations. Different arrangements were fabricated and tested, including: (1) direct electrode contact that allows current flow through the sample, (2) single electrode contact but no current path, and (3) no electrode contact with the solution. (FIG. 13) The materials facilitate the application of extremely high electric fields. Field strengths as high as 5000 V over ~150-300 µm, or approximately 15-40 MV/m were achieved.

This method allows for driving redox chemistry in a microfluidic device as a trigger for protein structural changes. Both static electric fields and oscillating electric fields can be applied. Stroboscopic measurements where the timing of the X-ray analysis is synchronized with the voltage changes allow for the observation of time-resolved structural changes. While the disclosure is applied to the X-ray diffraction analysis of protein crystals, these techniques can also be applied to align protein molecules in solution for small-angle X-ray scattering experiments and improve signal quality, as well as other X-ray analysis techniques. These devices also have potential to enable other experiments where metal electrodes are incompatible with the technique, such as electron paramagnetic resonance spectroscopy (EPR).

The use of atomically-thin graphene films minimizes the amount of material surrounding a crystal while serving as a vapor-diffusion barrier that is stable against significant water loss over the course of weeks. This approach enables incubation of protein crystallization trials and direct in situ analysis of the resulting crystals.

The barrier properties of graphene films are harnessed to enable the room temperature analysis of protein targets that are sensitive to the presence of oxygen, and that the conductivity of graphene can be exploited for the straightforward application of electric fields during X-ray data collection to modulate or trigger protein structural dynamics.

The high-throughput graphene-based fixed-target devices disclosed herein enable the study of protein structural dynamics. The multi-pronged approach takes advantage of the barrier properties of graphene films to provide sample stability against dehydration while maximizing signal-to-noise.

First, this disclosure focuses on the design and fabrication of array-style devices that are compatible with serial data collection procedures at both synchrotrons and XFELs. Second, the disclosure takes advantage of the conductivity of graphene to facilitate examination of the effect of applied electric fields on protein structure during data collection, including for time-resolved experiments using the recently reported electric field-stimulated X-ray crystallography (EFX). Third, the disclosure further refines the device fabrication to procedures to enable the room temperature analysis of crystals in an oxygen- and metal-free environment for the parallel analysis of oxygen-sensitive metalloproteins via X-ray diffraction, UV-Vis, and EPR spectroscopy.

Figure 1:
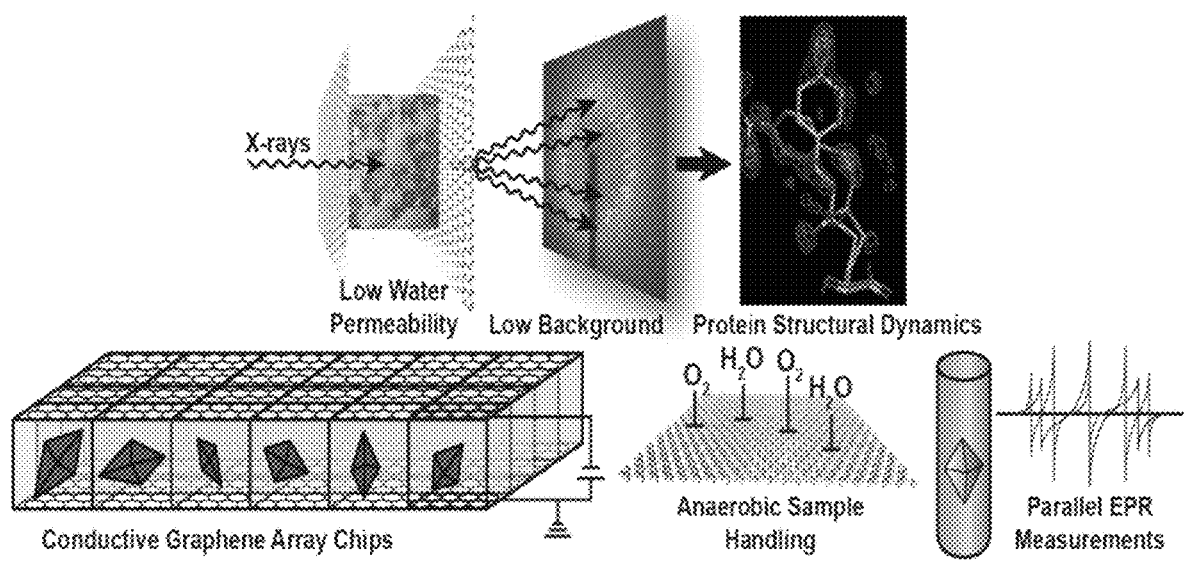
FIG. 1. Schematic overview of graphene microfluidics being used for protein structural dynamic analysis via high-throughput serial crystallography through stable, low background array chips for sample modulation by application of electric fields, handling of oxygen sensitive targets, and parallel measurements using EPR spectroscopy and/or other techniques.
Figure 2:
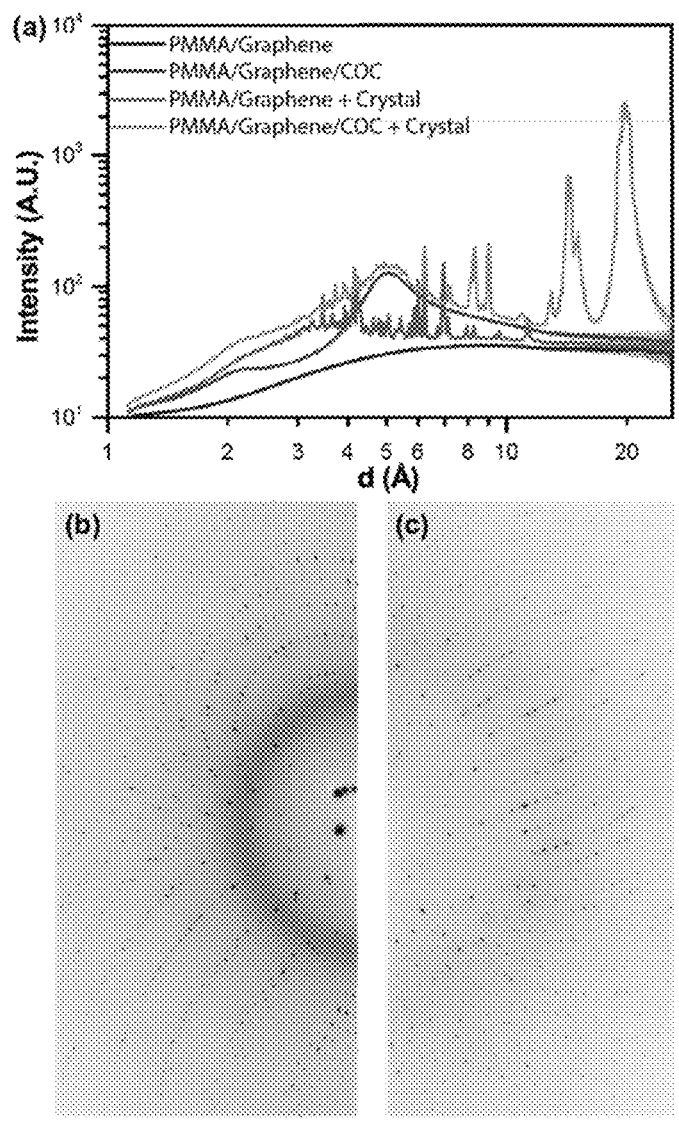
FIG. 2. (a) 1D integrated X-ray intensity profiles showing the impact on signal-to-noise resulting from 100 μm COC film in a graphene-based device. The corresponding 2D diffraction images for a device (b) with (orange) and (c) without (magenta) the COC film.
Figure 3:
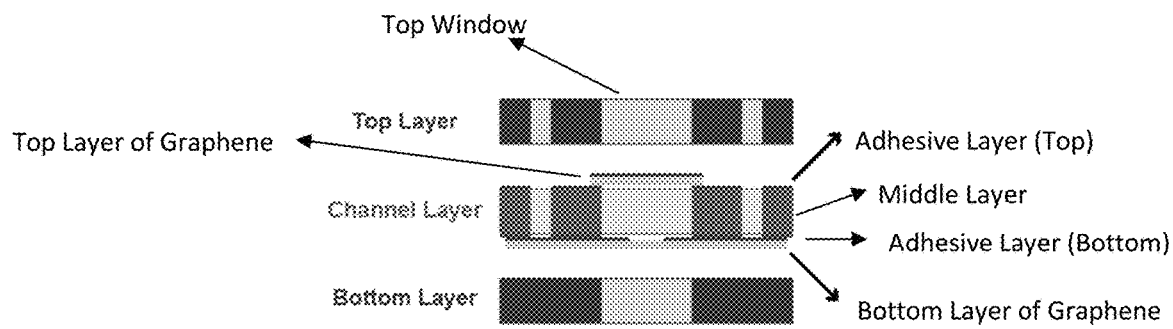
FIG. 3. Schematic depiction of the fabrication scheme for thin-film graphene-based microfluidics, using a channel-based counter-diffusion as the example. (1) CVD-grown graphene on copper is first coated with a layer of PMMA, and then released from the copper substrate by etching. The subsequent film is floated on the surface of water for (2) transfer to an COC layer defining half of the channel, or device architecture. Two channel layers are assembled between two capping layers of COC that define the window areas of the device. Inter-layer adhesion is achieved via thermal bonding or an ultra-thin epoxy adhesive. (3) A hydrophilic surface treatment can be used to facilitate easy filing of the final device via capillary action. An exploded view of a channel-style device is shown, along with images of various device configurations, lysozyme crystals grown on-chip, and a device attached to a magnetic base.
Figure 3:
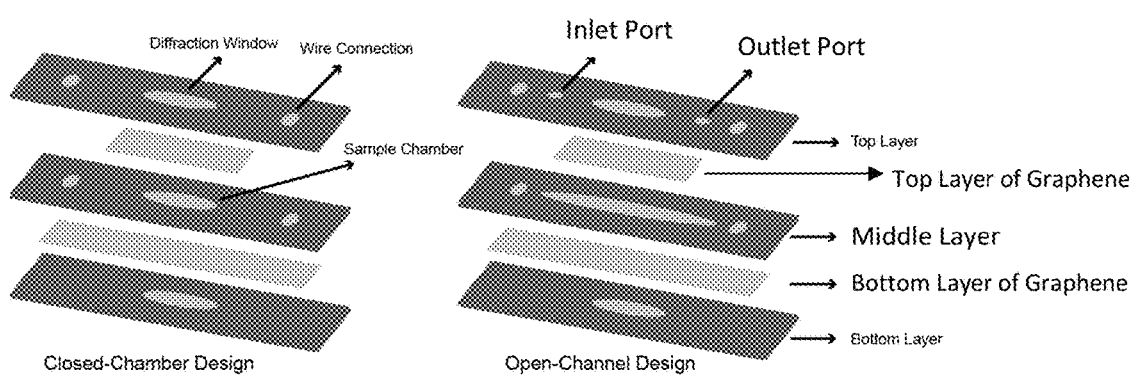
Figure 3:
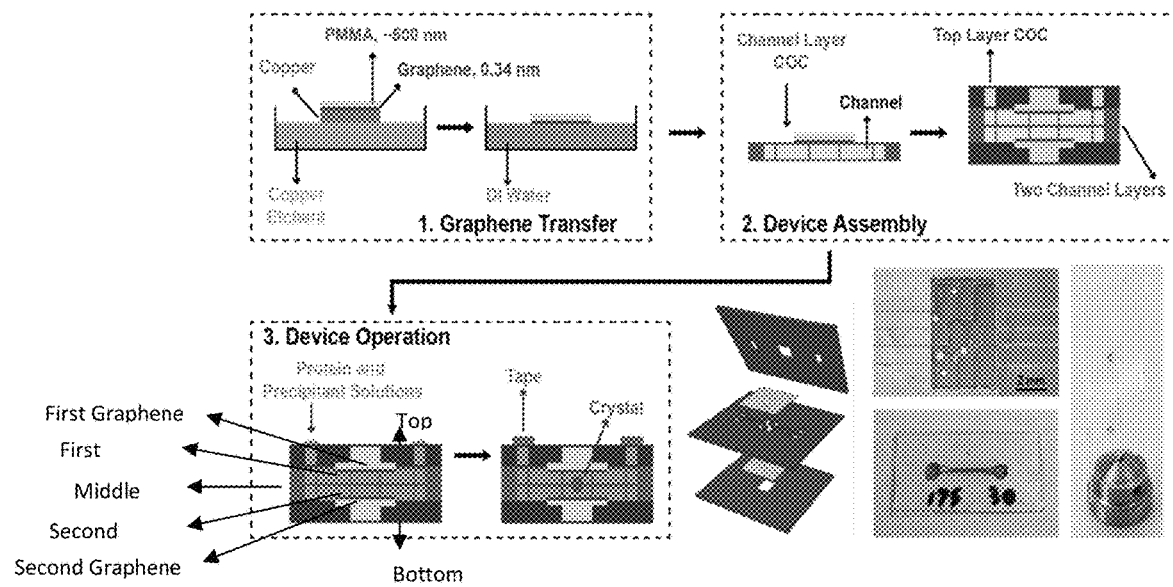

This disclosure extends the graphene-based devices to make them compatible for use at XFELs. This requires the construction of a larger, array-style device capable of mounting hundreds or thousands of crystals. However, it is critical to ensure robust isolation of the various wells within the larger array. This will help to minimize the potential for damage from one portion of the array adversely affecting samples in other locations. This adaptation is critical for the successful translation of these platforms for data collection using an unattenuated beam at XFEL sources where a single X-ray pulse will destroy both the crystal and any device material in its path. The current device fabrication strategy was adapted to incorporate a dense microfabricated array of sample wells and achieve sample isolation either through thermal bonding or the use of an ultra-thin, low-viscosity epoxy adhesive (FIG. 3).

The disclosure additionally utilizes the graphene device architecture to enable the application of electric fields to addressable locations on chip during data collection. The conductive nature of graphene is harnessed to create device structures where X-ray transparent windows can also serve as electrodes for the application of electric fields on-chip. The robust fabrication scheme is used to fabricate array-style chips with individually-addressable graphene electrodes to allow for the application of an electric field to targeted samples during serial data collection. Important considerations are strategies for achieving effective electrical isolation between individual wells and the development of a robust interface to connect the array chip to a high voltage control source.

In addition, the application of sustained electric fields described above, also investigated was the utility of the conductive, graphene-based array chips for the use in electric field-stimulated X-ray crystallography (EF-X) experiments.

The disclosure establishes single crystal-scale platforms that provide an oxygen and metal-free environment. These devices enable anaerobic data collection on oxygen-sensitive proteins, as well as parallel characterizations including UV-Vis and EPR spectroscopy. While generally applicable, this work is focused initially on the characterization of metalloproteins, which are particularly sensitive to reduction. Thus, enabling both EPR and X-ray analysis of the same sample allows for direct quantification of any changes in the oxidation and/or radical states present, while maintaining an anaerobic environment.

Thus, disclosed herein is a straightforward method for the incorporation of graphene-based electrodes into an ultra-thin, X-ray compatible microfluidic platform. This setup enables in situ X-ray diffraction data collection for electro-crystallization experiments. The obtained data agree with previous reports, showing faster crystal nucleation and an improvement in signal-to-noise for crystals grown in the presence of an electric field. Building on these results, the microfluidic approach has the potential to enable high-throughput analysis of a tremendous range of crystallization and electric field conditions to better map out the effect of these parameters on crystal quality in general. This approach is also amenable to serial crystallography experiments where the disclosed microfluidic array chip can be used to grow hundreds or thousands of microcrystals for serial diffraction analysis. Looking beyond structural biology, the integration of ultra-thin graphene electrodes into microfluidic devices can similarly enable powerful high-throughput experiments in a range of other fields.

In one aspect, the invention generally relates to an electro-microfluidic device, comprising: a top layer comprising a top support layer and one or more top layer(s) of graphene, wherein the top layer exhibits an optically clear top window area; a bottom layer comprising a bottom support layer and one or more bottom layer(s) of graphene, wherein the bottom layer exhibits an optically clear bottom window area; a middle layer sandwiched between the top layer and the bottom layer having a patterned cavity defining a sample holding chamber; a cathode electrically connected to the proximal portion of one or more layer(s) of graphene on top and/or bottom; and an anode electrically connected to the distal portion of one or more layer(s) of graphene on top and/or bottom configured to allow application of an electric field within or across the microfluidic device. The top window area is comprised of at least a portion of the top layer(s) of graphene, and the bottom window area is comprised of at least a portion of the bottom layer(s) of graphene.

In certain embodiments, the electro-microfluidic device further comprises: an inlet port in fluidic communication with the sample holding chamber; and an outlet port in fluidic communication with the sample holding chamber.

In certain embodiments, the top support layer comprises a UV curable plastic material, a glass, silicon or silicon nitride material, a thermal plastic material, etc. In certain embodiments, the top support layer comprises a UV curable plastic material.

In certain embodiments, the bottom support layer comprises a UV curable plastic material, a glass, silicon or silicon nitride material, a thermal plastic material, etc. In certain embodiments, the bottom support layer comprises a UV curable plastic material.

In certain embodiments, the top layer and the middle layer is joined together by an adhesive layer therebetween.

In certain embodiments, the bottom layer and the middle layer is joined together by an adhesive layer therebetween.

In certain embodiments, the sample holding chamber is from about 10 µL to about 10 (e.g., from about 10 µL to about 1 µL from about 10 µL to about 500 nL, from about 10 µL to about 100 nL, from about 10 µL to about 10 nL, from about 10 µL to about 1 nL, from about 100 µL to about 10 from about 1 nL to about 10 from about 10 nL to about 10 from about 100 nL to about 10 from about 10 µL to about 1 nL, from about 100 µL to about 1 from about 1 µL to about 10 µL) in volume.

In certain embodiments, the electro-microfluidic device has an overall thickness from about 10 µm to about 1 mm (e.g., from about 10 µm to about 500 µm, from about 10 µm to about 100 µm, from about 10 µm to about 50 µm, from about 50 µm to about 1 mm, from about 100 µm to about 1 mm, from about 500 µm to about 1 mm, from about 50 µm to about 500 µm, from about 100 µm to about 500 µm).

In certain embodiments, each of the top and bottom windows is from about 100 µm$^2$ to about 1 cm$^2$ (e.g., from about 400 µm$^2$ to about 1 cm$^2$, from about 900 µm$^2$ to about 1 cm$^2$, from about 2,500 µm$^2$ to about 1 cm$^2$, from about 10,000 µm$^2$ to about 1 cm$^2$, from about 1 mm$^2$ to about 1 cm$^2$, from about 9 mm$^2$ to about 1 cm$^2$, from about 25 mm$^2$ to about 1 cm$^2$, about 10 mm$^2$ in size, from about 10 mm$^2$ to about 50 mm$^2$ in size, from about 50 mm$^2$ to about 1 cm$^2$ in size).

In certain embodiments, each of the top and bottom layers of graphene is a graphene film comprising one or more graphene layers having a size from about 1 mm$^2$ to about 60 cm$^2$ (e.g., from about 2 mm$^2$ to about 60 cm$^2$, from about 10 mm$^2$ to about 60 cm$^2$, from about 1 cm$^2$ to about 60 cm$^2$, from about 10 cm$^2$ to about 60 cm$^2$, from about 1 mm$^2$ to about 10 cm$^2$, from about 1 mm$^2$ to about 5 cm$^2$, from about 1 mm$^2$ to about 1 cm$^2$, from about 1 mm$^2$ to about 50 mm$^2$, from about 1 mm$^2$ to about 20 mm$^2$, from about 5 mm$^2$ to about 1 cm$^2$, from about 10 mm$^2$ to about 1 cm$^2$).

In certain embodiments, the graphene film is patterned.

In certain embodiments, each of the top and bottom layers of graphene is a single graphene film having a thickness from one atomic layer to about 10 or more (e.g., 1, 2, 3, 4, 5, 6, 7, 8, 9, 10 or more) atomic layers.

In certain embodiments, each of the top and bottom layers of graphene is a graphene film of one atomic layer. In certain embodiments, each of the top and bottom layers of graphene is a graphene film of two or more atomic layers.

The devices of the invention are designed to maintain a desired environment for samples under analysis. In certain embodiments, one or more layer(s) of graphene in the device serve as a vapor diffusion barrier(s) (e.g., to water vapor, oxygen, CO, $CO_2$, Xenon, etc.). In certain embodiments, one or more layer(s) of graphene in the device serve as a diffusion barrier(s) to water vapor. In certain embodiments, one or more layer(s) of graphene in the device serve as a diffusion barrier(s) to oxygen. In certain embodiments, one or more layer(s) of graphene in the device serve as a diffusion barrier(s) to both water vapor and oxygen.

In another aspect, the invention generally relates to an array device (or device array or network) having two or more microfluidic devices according to the invention.

In certain embodiments, the array device includes from about 2 to about 1,536 of (e.g., from about 2 to about 960, from about 2 to about 768, from about 2 to about 576, from about 2 to about 384, from about 2 to about 96) the microfluidic devices disclosed herein.

In another aspect, the invention generally relates to a method for fabricating an electro-microfluidic device, comprising: providing a first graphene film comprising one or more layer(s) of graphene and a second graphene film comprising one or more layer(s) of graphene; transferring the first graphene film to a support layer forming a top layer with a window area defined by the first graphene film; transferring the second graphene film to a support layer forming a bottom layer with a window area defined by the second graphene film; forming the microfluidic device by bonding a middle layer to and between the top and the bottom layers to form a sandwiched construct having a cavity for holding a sample defined by the top and bottom layers and the pattern of the middle layer, and a first and second channels connecting to the second graphene film at a proximal and a distal location; and providing a conductive material (e.g., a liquid alloy, solder, conductive epoxy) to the first and second channels so as to form electric connectivity to the second graphene film.

In yet another aspect, the invention generally relates to an electro-microfluidic device fabricated by a method disclosed herein.

In yet another aspect, the invention generally relates to a method for growing crystalline or non-crystalline materials, comprising: growing one or more crystalline or non-crystalline materials in the sample chamber of an electro-microfluidic device disclosed herein under a controlled application of an electric field.

In certain embodiments, the crystalline or non-crystalline materials are of a biological material, for example, a protein or a nucleic acid (e.g., DNA or RNA).

In yet another aspect, the invention generally relates to a method of electro-crystallization and X-ray scattering or diffraction analysis, comprising: growing one or more crystalline or non-crystalline materials in the sample chamber of an electro-microfluidic device disclosed herein, optionally under a controlled application of an electric field; directing an X-ray beam to the one or more crystalline or non-crystalline materials via the top or bottom window of the microfluidic device; and measuring the X-ray scattering or diffraction of the one or more crystalline or non-crystalline materials via the bottom or top window of the electro-microfluidic device.

In certain embodiments, measuring the X-ray scattering or diffraction is conducted with the one or more crystalline or non-crystalline materials being under an electric field (e.g., a static, oscillating or pulsed electric field).

In certain embodiments, the crystalline or non-crystalline materials are of a biological material.

In certain embodiments, the biological material is a protein, a nucleic acid, or a biopolymer (e.g., a sugar-based biopolymer).

In certain embodiments, the method comprises measuring the X-ray scattering of the one or more crystalline or non-crystalline materials.

In certain embodiments, the method comprises measuring the X-ray diffraction of the one or more crystalline or non-crystalline materials.

In certain embodiments, controlled application of an electric field results in modulation of a structural property of the biological material.

In certain embodiments, controlled application of an electric field results in modulation of a structural property of the protein sample.

In certain embodiments, 8 or more (e.g., 16, 32, 64, 128 or more) crystalline or non-crystalline materials are grown and measured simultaneously. In certain embodiments, 64 or more crystalline or non-crystalline materials are grown and measured simultaneously.

EXAMPLES

Graphene Film Preparation

Large area graphene was synthesized on a copper substrate (Graphene Platform) by chemical vapor deposition in a quartz tube furnace (Planar Tech) using standard methods [48-51]. After synthesis, the back side of the copper substrate was scrubbed with a Kimwipe to remove residual graphene. Patterning of the graphene electrodes was achieved using two different methods. The first method simply used thin-tip tweezers (TDI International Inc.) to scratch a narrow line into the graphene/copper film. The second method defined the desired structure of the electrodes using a protective mask made from a piece of thermal release tape (Semiconductor Equipment Corp.) cut to the desired shape using a cutting plotter (Graphtech CE6000), followed by a 5-minute etching of the exposed graphene by an oxygen plasma (Harrick Plasma). Following patterning of the graphene electrodes, a roughly 500-nm thick layer of poly(methylmethacrylate) (950PMMA A4, Microchem) was then spin coated (Specialty Coating Systems) onto the graphene at 1000 rpm to serve as a support layer. The PMMA film was cured at 120° C. for 10 minutes. The resulting PMMA/graphene film was then released from the copper substrate by back-etching of the copper in an aqueous solution of $FeCl_3$ copper etchant (Transene) for 3 hours, followed by three rinse cycles in MilliQ water (18.2 MΩ-cm, Millipore Inc.). The graphene film floats on the surface of water and was transferred directly onto the target substrate by lifting it from the water surface. The assembled layers were then allowed to dry at room temperature.

Device Architecture

Figure 4:
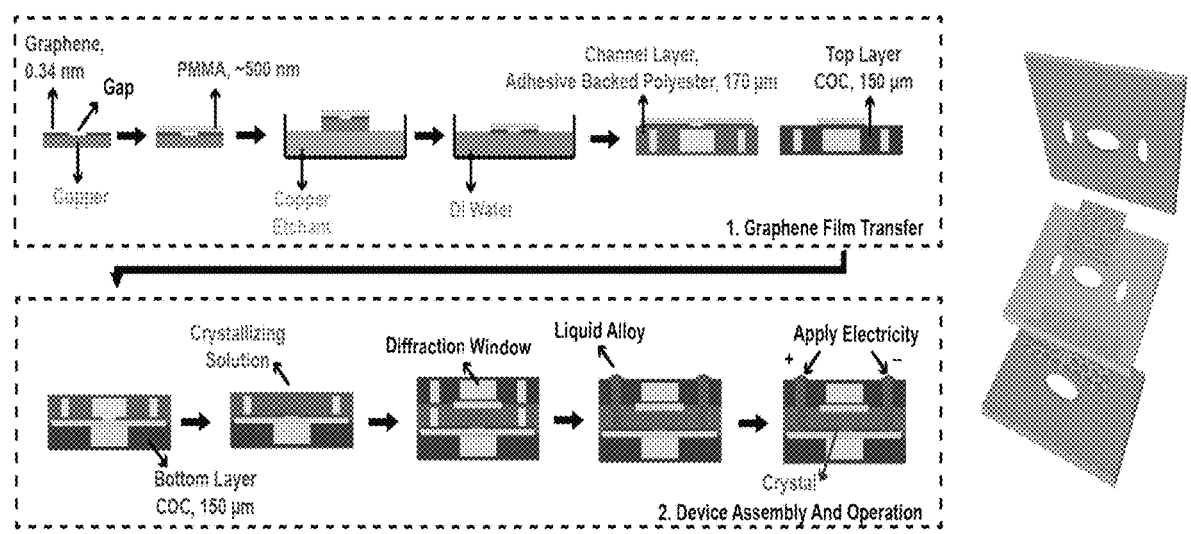
FIG. 4. Schematic illustration of the fabrication scheme and device architecture for thin-film graphene-based microfluidics. (1) A patterned graphene film on copper is first coated with a layer of PMMA, and then released from the copper substrate by etching. The subsequent film is floated on the surface of water for transfer to either an adhesive-backed polyester film that defines the crystallization chamber or a COC film to form the top layer of the device. (2) Assembly of the device proceeded with the application of a COC bottom layer to the crystallization layer assembly to provide additional stability. Following the addition of crystallization solution, the device is then sealed with the COC top layer. Electrical contact to the graphene electrodes is made using a liquid alloy, and the electro-crystallization experiment can take place.
Figure 5:
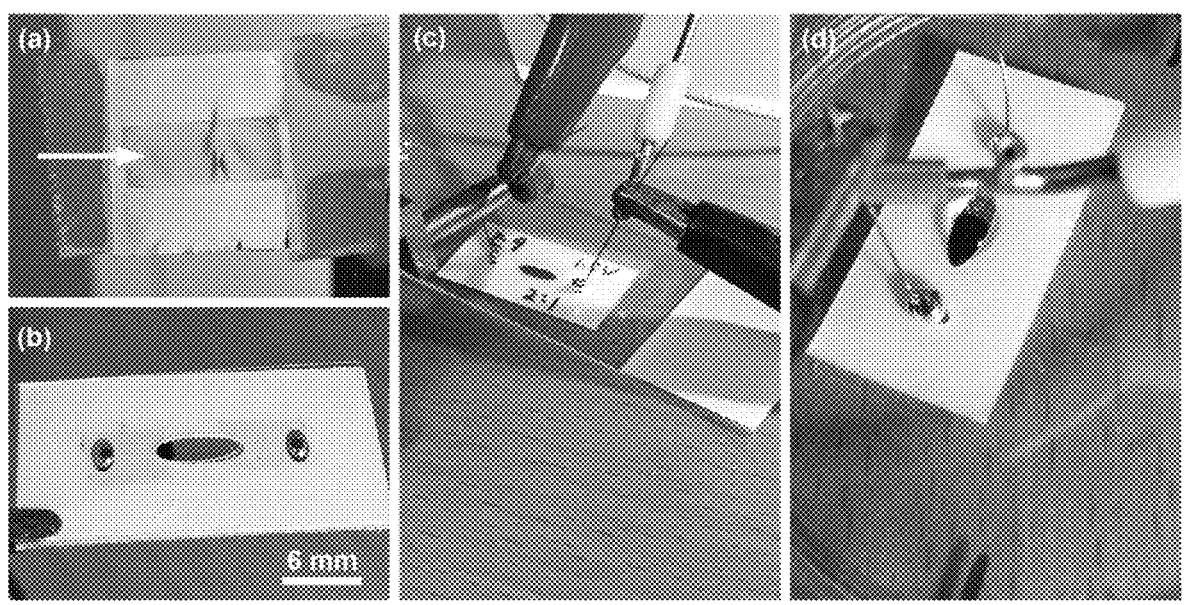
FIG. 5. (a) Graphene film on copper growth substrate after oxygen plasma treating. The brassy yellow area in the middle of the film was exposed to the plasma while the upper and lower regions were covered and protected by a mask created from thermal release tape. (b) A view of the patterned electrodes (regions of light grey) in an assembled device. (c) System setup for electro-crystallization experiments. Alligator clips attached to metal needles and gallium-indium alloy droplets were used to make electrical contact with the integrated graphene electrodes. (d) The presence of an applied electric field can be observed visually based on the color change from clear to purple of methyl viologen undergoing reduction at the cathode.

The structure of the microfluidic platform was designed to enable the application of an internal electrical field to the crystallization solution through patterned graphene electrodes (FIG. 4). The overall device structure was assembled around a chamber cut into a 100-μm double-sided adhesive-backed polyester film (Adhesive Research #90668) using a cutting plotter (Graphtec CE6000). The layer containing the patterned graphene/PMMA electrode was adhered onto this film with the gap in the electrodes located near the center of the chamber. A supporting frame of COC with window structures aligned to the crystallization chamber was adhered to the outside of the notched graphene/PMMA film to provide mechanical stability. After filling of the device, the chamber was sealed with a top layer containing a smaller, unmodified graphene/PMMA film, supported on a COC frame. In contrast to the electrode layer, the top graphene/PMMA film was oriented with the PMMA layer facing the crystallization chamber so that the graphene would not contribute to the conductivity of the cell. Finally, small side features cut into the polyester film and the top support layer of COC were filled by a gallium-indium liquid alloy (Sigma Aldrich) to create the electrode contact between graphene films and the electrode needles running to a power supply (FIG. 5). It should be noted that the thickness of the adhesive layer used to define the crystallization chamber can be modulated to match the size of the resulting crystals and minimize the amount of excess liquid surrounding crystals during data collection.

Electrode Characterization

Figure 6:
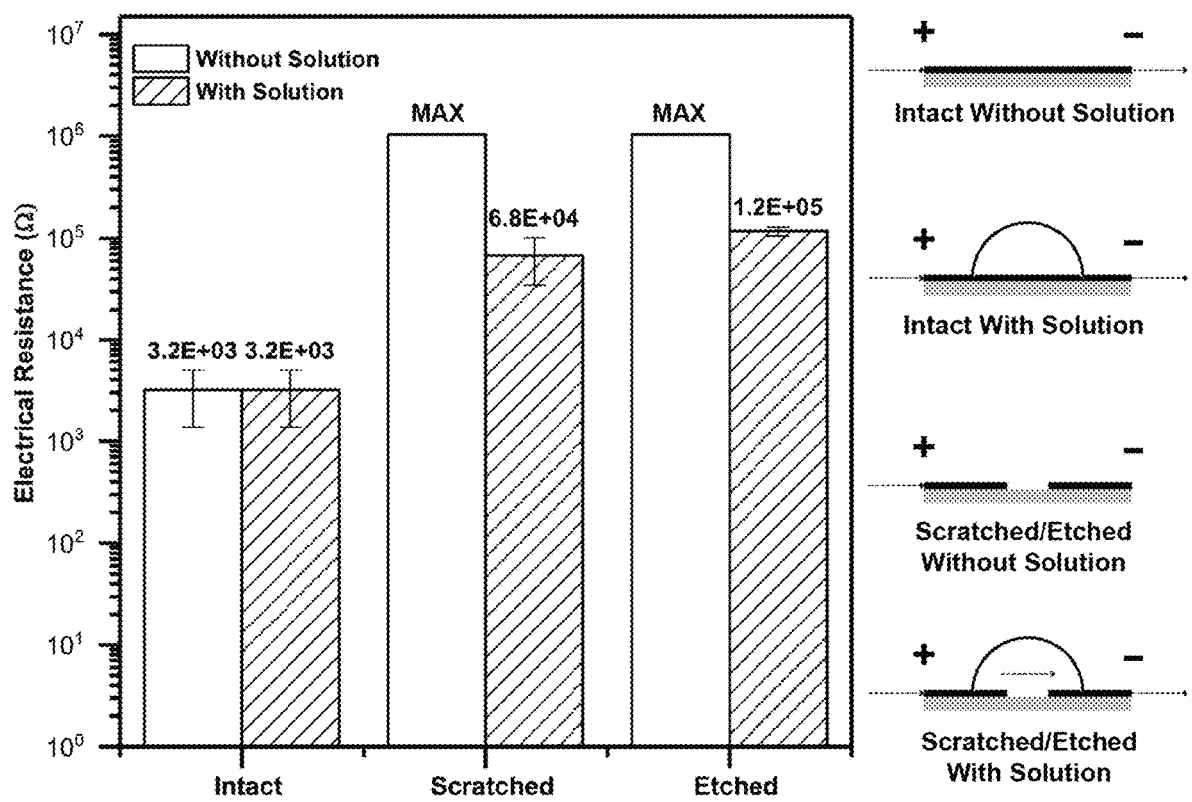
FIG. 6. Plot of the measured average electrical resistance of an intact graphene film, a graphene film where electrodes were fabricated by physical scratching, and a graphene film where the electrode structure was created by plasma etching. Data are shown for both the electrode structure alone (without solution, clear bars) and for a device filled with crystallization solution (hatched bars), and are the average of measurements from three separate devices. The MAX resistance measured for the two electrode structures in air suggests an infinite resistance, beyond the range of the instrument.

To quantitatively characterize the film electrical resistance at different conditions, the voltage resulting from a current sweep from 0 to 100 μA was measured using a semiconductor characterization system (Keithley 4200 SCS) on intact graphene films and patterned graphene electrodes in air, and in the presence of a crystallization solution (FIG. 6). Electrodes patterned by both physical abrasion and plasma etching were compared. The corresponding electrical resistances were calculated based on the resultant voltage-current relationships and the device architecture. All tests were performed in triplicate.

Redox Chemistry Testing

Figure 7:
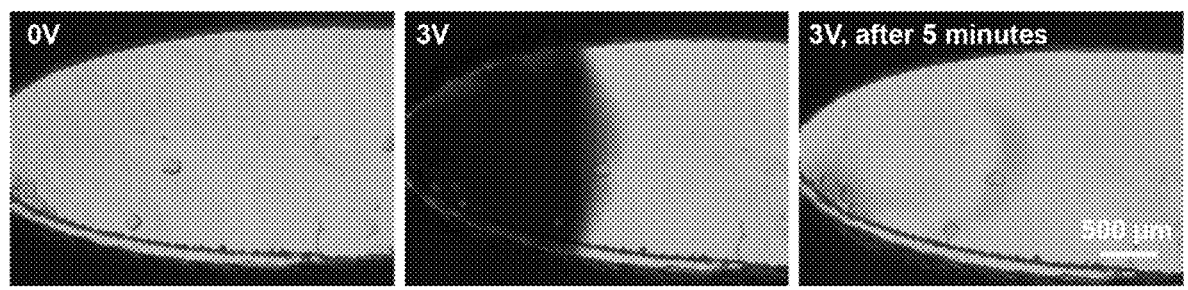
FIG. 7. Optical micrographs of an electro-crystallization device containing 150 mM methyl viologen (MV) and crystals of lysozyme under the influence of 0V, 3V, and 3V at longer times. The initial color change from clear to purple is the result of the reduction of $MV^{2+}$ to $MV^+$, while the subsequent loss of color at higher voltages and longer times is due to the further reduction from $MV^+$ to $MV^0$. The pale-yellow color of the $MV^0$ was difficult to discern compared to the fully oxidized $MV^{2+}$ species because of the small path length in the microfluidic devices. Color changes were only observed in the vicinity of the cathode.

Methyl viologen (MV) is a redox and oxygen-sensitive dye. A solution of methyl viologen (Sigma Aldrich) in water was prepared at 150 mM. In the presence of oxygen, methyl viologen is present as fully oxidized $MV^{2+}$, resulting in a colorless solution. The partially oxidized $MV^+$ species is a brilliant purple, while the fully reduced, neutral $MV^0$ is typically light-yellow. To test the ability of the disclosed graphene-based devices to conduct electricity and drive redox chemistry, 10 μL of fully oxidized methyl viologen was placed onto a patterned graphene electrode. An applied voltage was then slowly increased from 0V to 3V and then held at 3V for 5 minutes, during which time the subsequent color changes were observed (FIG. 7).

Protein Crystallization and X-Ray Diffraction

Hen egg white lysozyme (HEWL, Hampton Research Inc.) was prepared in 50 mM sodium acetate (Fisher) and 20% (w/v) glycerol (Fisher) with a concentration of 80 mg/mL at pH 4.8. Protein solution was then fully mixed by vortexing with a precipitant solution containing 0.68 M sodium chloride (Sigma) and 50 mM sodium acetate at pH 4.8 at a volumetric ratio of 2:3. All solutions were filtered before use through a 0.2 μm membrane (Millipore) to remove impurities. Crystallization was performed using a microbatch-type method; 3.2 μL of mixed solution was pipetted immediately after preparation and sealed into the device. It should be noted that the volume of solution added to the device should be carefully controlled to match the volume of the chamber as excess liquid will be squeezed out of the chamber and will adversely affect device sealing.

Figure 8:
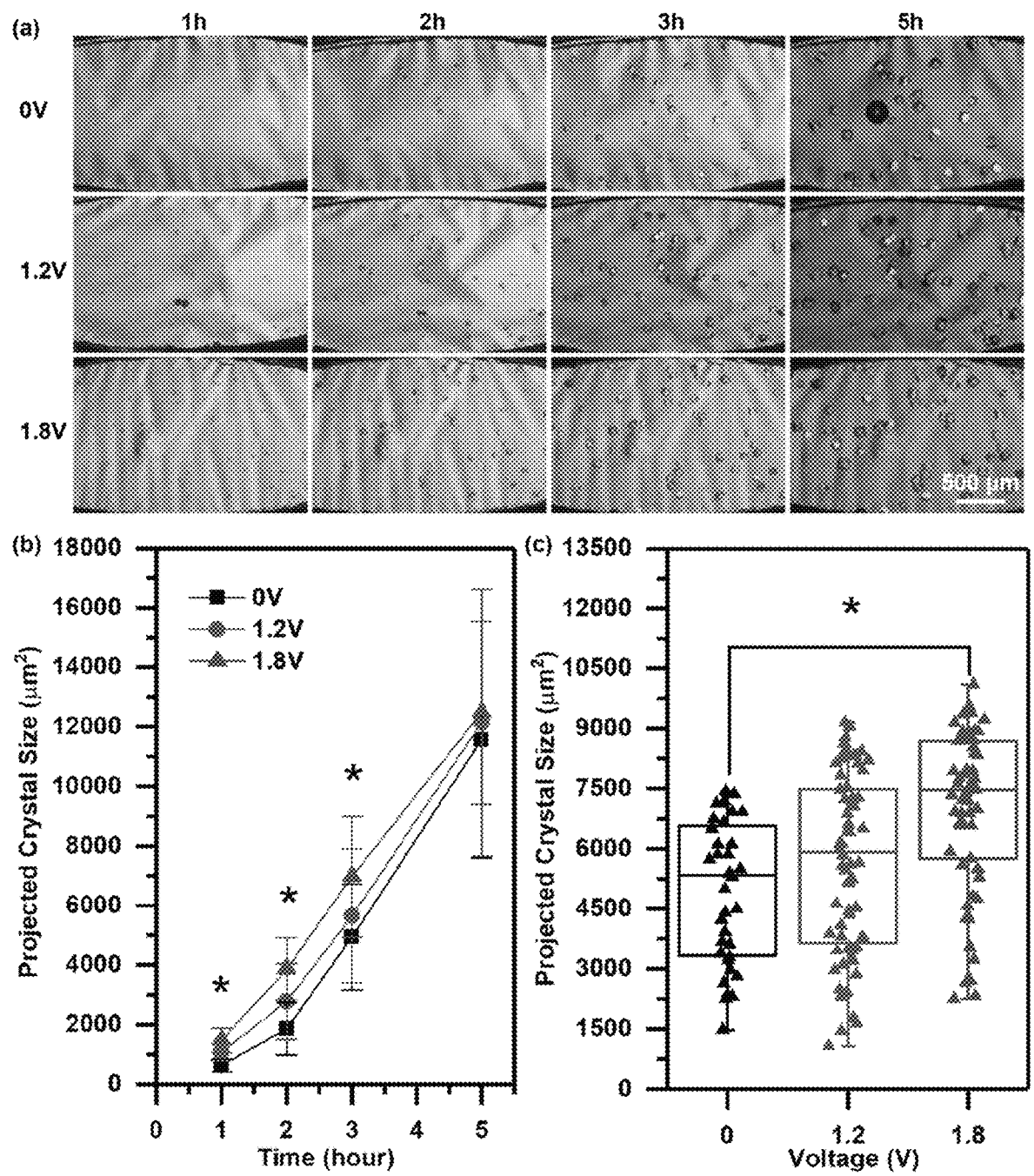
FIG. 8. (a) Optical micrographs under cross-polarized light showing the time evolution of HEWL crystal nucleation and growth with the application of 0V, 1.2V, and 1.8V in a microfluidic device. (b) A plot of the average crystal size as a function of time from the images in (a). Error bars represent the standard deviation. (c) A box and whiskers plot of the crystal size distribution at 3 h with the application of voltages at 0V, 1.2V and 1.8V. The middle line shows the median, and the ends of the box indicate the upper and lower quartiles. *Crystals prepared at 1.8V at 1 h, 2 h and 3 h were statistically larger than those prepared at 0V, ANOVA p<0.01.
Figure 11:
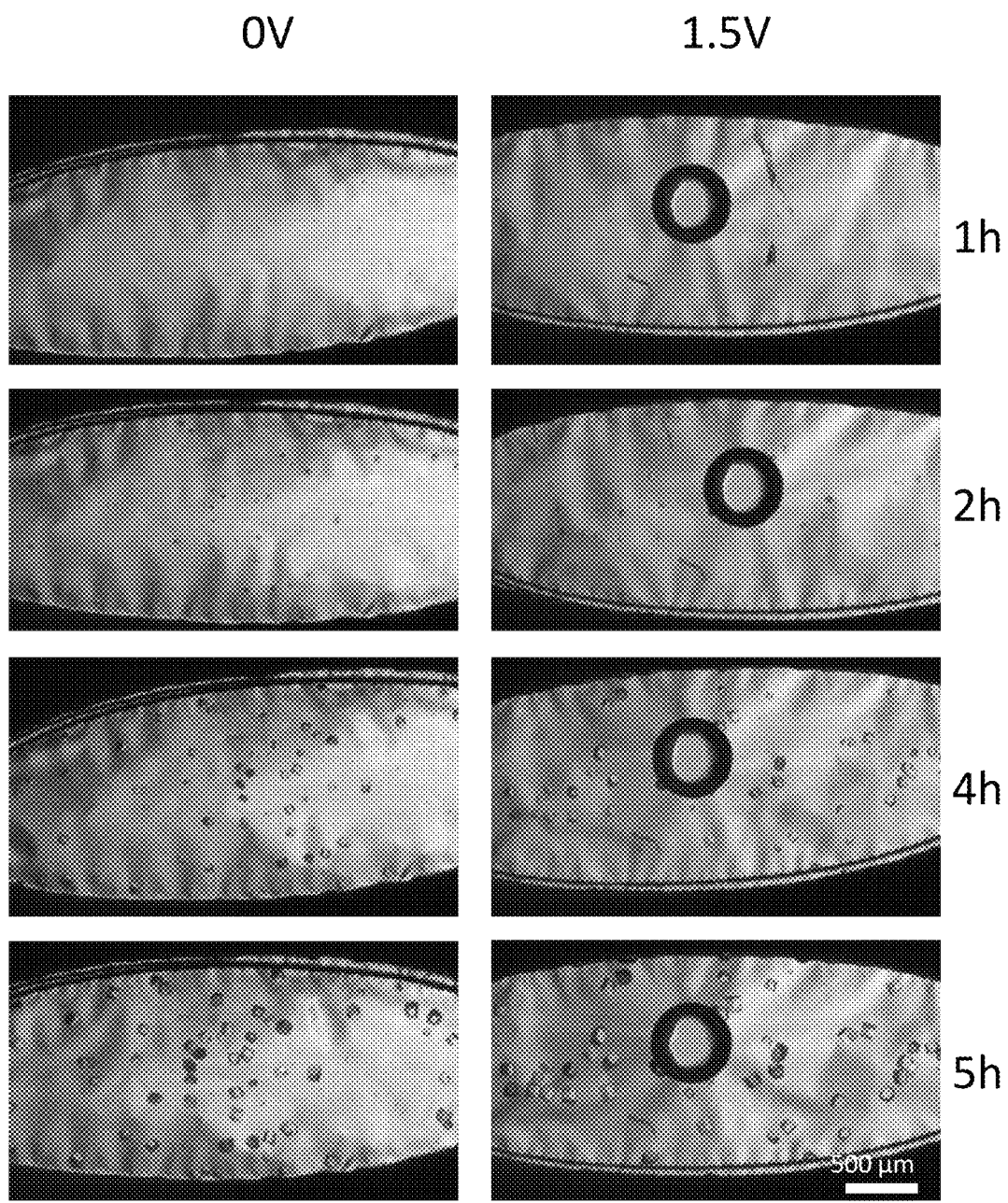
FIG. 11. Optical micrographs under cross-polarized light showing the time evolution of HEWL crystal nucleation and growth with the application of 0V and 1.5V in a microfluidic device. The bubble observed in the 1.5V sample was the result of air trapped in the device during assembly.

The crystallization experiment was performed in a 4° C. cold room under different applied voltages using a potentiostat (Arksen 305-2D). For a given experiment, simultaneous tests were performed on multiple devices at the applied voltage, alongside a control device with no applied voltage. Crystal growth was monitored hourly using a stereomicroscope (Zeiss SteREO Discovery V12) under cross-polarized light (FIGS. 8a and 11). After crystallization was complete, the devices were disconnected from the voltage supply and were sealed in petri dishes (Fisher) and stored at 4° C. prior to X-ray analysis. Replicate crystallization experiments were performed over a range of applied voltages (0V to 1.8V), demonstrating the reproducibility of the disclosed approach.

Figure 12:
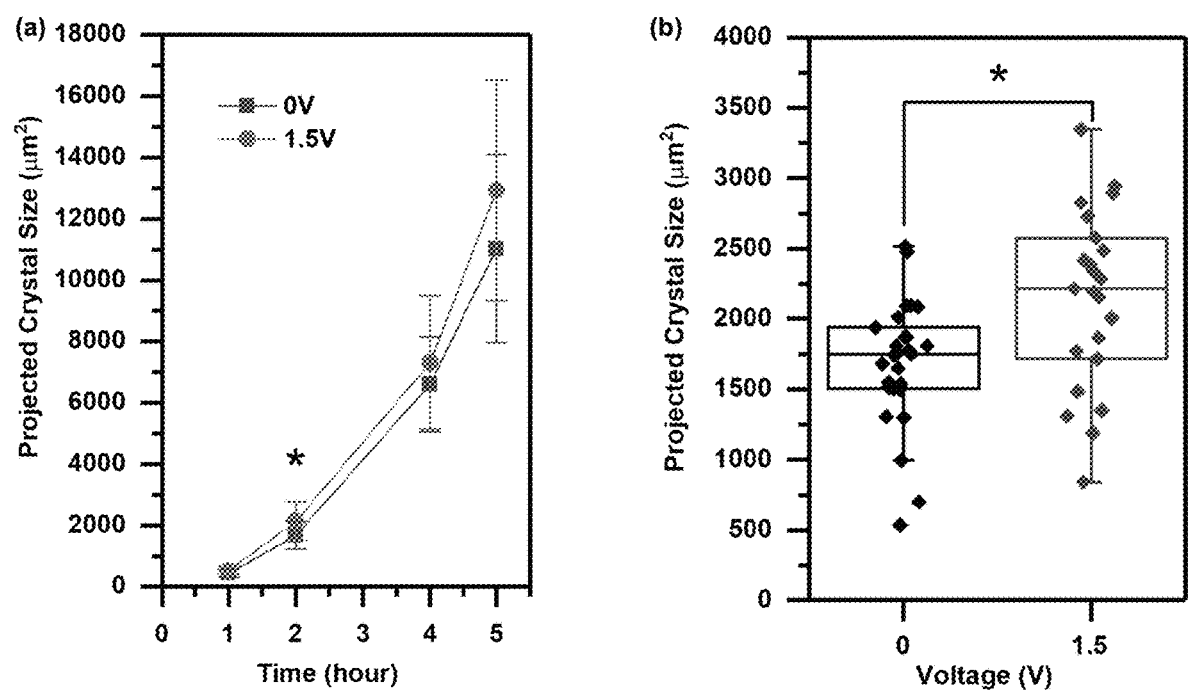
FIG. 12. (a) A plot of the average crystal size as a function of time from the images in FIG. 11. Error bars represent the standard deviation. (b) A box and whiskers plot of the crystal size distribution at 2 h with the application of voltages at 0V and 1.5V. The middle line shows the median, and the ends of the box indicate the upper and lower quartiles. *Crystals prepared at 1.5V at 2 h were statistically larger than those prepared at 0V, ANOVA p<0.01.

Quantification of crystal size as a function of time was done using the size measurement function in ImageJ software (NIH) [56] by manually outlining crystal edges. Crystals appeared to be randomly oriented. However, the overall aspect ratio of the crystals was similar, allowing for the reasonable use of a calculated two-dimensional area to represent the three-dimensional size of a crystal. For each time point, all crystals in each chip were measured and the average projected area calculated (FIGS. 8b, 8c and 12). Error bars represent the standard deviation from the mean. A comparison between crystal sizes at different time points and voltage conditions was performed using ANOVA. While the data in FIG. 5 represent the results of only three individual devices, replicate experiments show similar trends, relative to controls (see FIGS. 11 and 12).

Figure 9:
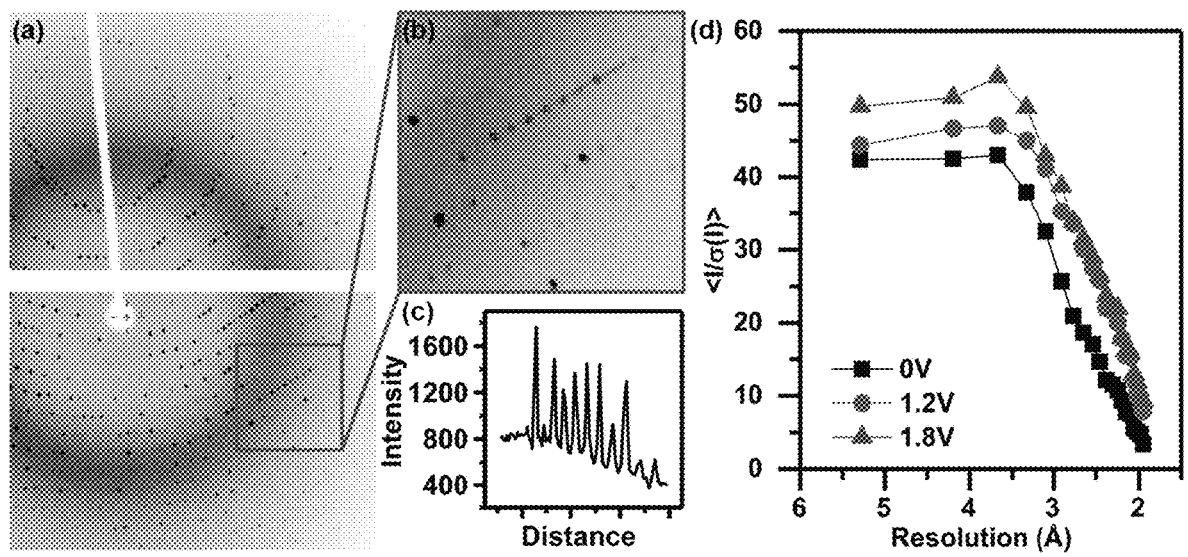
FIG. 9. (a) A typical obtained X-ray diffraction pattern and (b) a magnified view showing details of diffracted spots. (c) Pixel intensity along the blue line in the inset indicating the high levels of signal-to-noise observed in the data. (d) A plot of signal to noise ratios at different resolution shells of diffraction patterns from crystals grown under different voltages.
Figure 10:
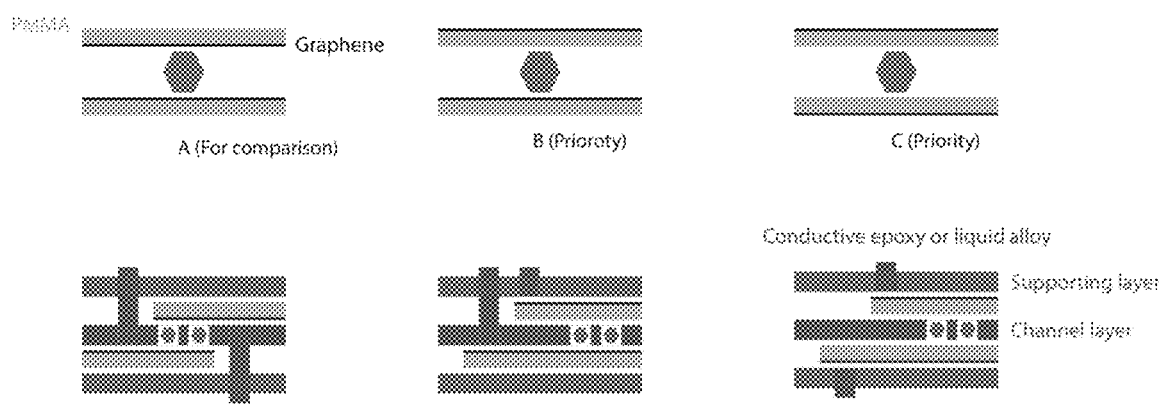
FIG. 10. Architectures and device setups.
Figure 10:
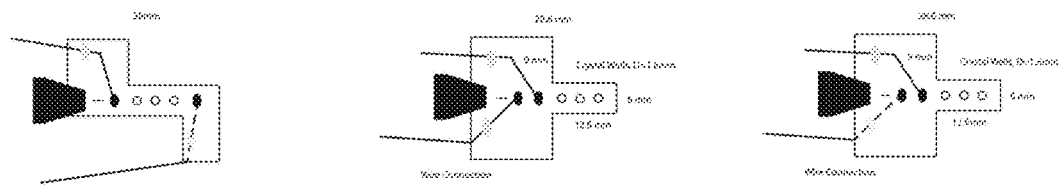

Immediately after crystallization, the chips were stored in 4° C. and analyzed within a couple of days. The chip was mounted on the goniometer using a custom magnetic mounting base (Crystal Positioning Systems). The X-ray system (Rigaku XtalAB PRO MM007) operated at an X-ray wavelength of 1.542 Å and a beam size of ~200 μm, along with a PILATUS3 R 200K detector. The chip was initially mounted perpendicular to the beam path. Crystal targeting and focusing and were done by adjusting the goniometer positions. The sample-to-detector distance was set at 40 mm, giving a maximum resolution of 1.95 Å. A 10s exposure and 1° oscillation were used. Before collecting a complete dataset, the sample orientations corresponding to the first and last frames were tested to avoid overlapping signals from nearby crystals. The collected diffraction patterns were then analyzed using the HKL 3000 software package (HKL Research Inc.) for indexing, refinement, integration, and scaling. The X-ray diffraction data extended to the maximum resolution limit of the X-ray setup, showing a signal-to-noise level in the highest resolution shell of $I/\sigma(I)>3.0$ for all samples (FIG. 9, Table 1).

Electro-Crystallography

Protein crystals were transferred into an electro-crystallography device via pipetting. X-ray analysis under the application of an electric field was performed at beamline 7-1 at the SSRL. (FIGS. 13-19.) Experiments were performed using three different electrode configurations: (1) direct electrode contact that allows current flow through the sample, (2) single electrode contact but no current path, and (3) no electrode contact with the solution. The materials facilitate the application of extremely high electric fields. Field strengths as high as 5000 V over ~150-300 μm, or approximately 15-40 MV/m were achieved.

A key goal of this work was to take advantage of atomically-thin, conductive graphene films to enable electro-crystallization experiments in a microfluidic device, followed by in situ X-ray diffraction analysis of the resulting crystals. This work builds on previously-reported graphene-based platform for serial crystallography, but requires the fabrication and integration of patterned graphene electrodes, rather than simple graphene windows.

While it is possible to create a set of electrodes by simply adhering two separate pieces of graphene to a substrate, a more controlled fabrication strategy was disclosed to enable careful control of the electrode spacing and geometry. For example, a protective film of thermal release tape was used to facilitate direct patterning of the graphene using an oxygen plasma. Following plasma treatment and removal of the protective film, clear patterning of the graphene was observed revealing the underlying copper substrate (FIG. 5a). Thus, the width of the resulting gap can be easily controlled to modulate the electric field strength. Experiments were typically done using a gap size of 3 mm. A roughly 500 nm-thick layer of PMMA was then spin coated onto the graphene/copper surface to facilitate retention of electrode geometry after removal from the underlying copper substrate and transfer to the target device layers. The graphene electrodes could be observed on the fully assembled devices as areas of light grey color located on the ends of the microfluidic channel, relative to the white background of the middle adhesive channel layer of the device (FIG. 5b). This design takes advantage of relatively cheap materials and fabrication strategies, such that the material cost of a single device should be on the order of $1 (USD) or less, depending on economies of scale.

The resulting electrical properties of these plasma-etched graphene electrodes were compared with an analogous electrode layout fabricated by simple physical abrasion (FIG. 3). The electrical resistance of an intact graphene film was relatively low, and highly reproducible, as expected for an atomically-thin conductive material. While the effectively infinite resistance measured for the two electrode setups in air clearly demonstrated the separation of the two electrodes, clear differences were observed in the operation of the devices in the presence of crystallization solution. Devices with the electrodes fabricated via physical abrasion showed substantially lower and more variable resistivity values compared with the plasma etching method. The lower resistance observed for the physical abrasion method suggests the presence of graphene residue in the gap area between the electrodes. Thus, while this kind of simplified fabrication scheme can be applied, it has the potential to adversely affect both the performance and reproducibility of the resulting device in electro-crystallization experiments. Subsequent experiments were performed using plasma-etched electrodes.

To further visualize the effectiveness of the devices, methyl viologen (MV) was utilized as a redox-sensitive colorimetric indicator. The solution was observed to change from colorless ($MV^{2+}$) to brilliant purple ($MV^+$) near the cathode upon the application of 1V, consistent with the reported value of the redox potential for the $MV^{2+}+e^- \rightarrow MV^+$ reaction of ~0.7V (FIG. 5). A similar color change was observed for a slurry of lysozyme crystals containing methyl viologen (FIG. 7). In both experiments, the observed change in color only occurred in the area of the device defined by the cathode. It was theorized that the localization of this color change near the cathode is due to an enhancement of the redox reaction by the solid graphene electrode. Increasing the applied voltage to 3V resulted in an intensification of the observed purple color, due to the increased generation of the $MV^+$ species. However, after several minutes the solution transitioned from purple to clear, as $MV^+$ was further reduced to $MV^0$ (FIG. 7). Again, this result was expected based on the reported redox potential for the $MV^++e^- \rightarrow MV^0$ reaction. The pale-yellow color of the $MV^0$ was difficult to discern compared to the fully oxidized $MV^{2+}$ species because of the small path length in the microfluidic devices. It is also noteworthy that despite the potential for water electrolysis at these applied voltages, the reaction rate on graphene electrodes is relatively slow. Thus, the formation of bubbles was typically not observed during the course of an experiment.

Having demonstrated the electrical performance of the device, the electro-crystallization of lysozyme as a function of time was studied. With a 3 mm patterned gap on the graphene film, the applied voltage resulted in an electric field strength in the range of 0.4 V/mm to 0.6 V/mm, which is similar to a range reported in the literature. As shown in FIG. 5 and FIGS. 11 and 12, the presence of an applied voltage resulted in an increased rate of protein nucleation and growth, consistent with previous literature reports. Interestingly, these trends were only significant at short times. For instance, after 1 h, 2 h and 3 h, the average size of crystals grown under the influence of an applied voltage was statistically different compared to a control sample (FIGS. 8b and 8c), while this difference is lost by 5 h.

In addition to the effects on nucleation and growth, significant preferential localization of crystals within the device was not observed. This is in contrast to previous reports for the electro-crystallization of lysozyme where crystals were typically localized near the cathode. It was theorized that the broad spatial distribution of crystals as well as the similar crystal size at long times is a consequence of the relatively short time period over which these experiments were performed. The increased rate of crystal nucleation and growth associated with electro-crystallization is typically associated with electro-migration of the protein and subsequent increases in concentration near the relevant electrode. Thus, it is possible that the crystallization conditions used here fall very close to the nucleation region such that only minimal increases in the local protein concentration were necessary to facilitate nucleation, while allowing for the appearance of crystal growth throughout the device and the similarity of crystal size at long times.

After crystallization, the devices were stored at 4° C. for several days prior to X-ray diffraction analysis. A room temperature dataset was collected from a representative crystal grown under each of the applied voltage conditions (0V, 1.2V, 1.8V). Data were collected and analyzed to the maximum resolution of the diffraction setup. At this limit of 1.95 Å, the I/σ(I), or signal-to-noise level in the highest resolution shell, was above 3.0 for all samples, and was significantly higher for those samples prepared in the presence of an electric field, than those without (FIG. 9, Table 1). This high signal-to-noise was expected due to the minimal contributions of the device materials to the level of background noise. The size of the X-ray beam and the presence of nearby crystals limited the number of frames that could be collected from a given sample. While it was possible to collect nearly complete datasets for the 1.2V and 1.8V samples, a lower completeness was obtained for the 0V sample. Despite these differences, the data indicate that the crystals grown in the presence of an electric field may diffract to higher resolution than crystals grown without. It should be noted that, although the crystal size varied between the various voltage conditions at early time, this difference was lost at long times. Care was taken to select crystals of similar size. Thus, the difference in the observed signal-to-noise should not be a consequence of differences in crystal size. These results agree with previous literature reports where higher signal-to-noise was observed for crystals grown in an electric field. It is important to note that this is the first report where direct, in situ measurements of the X-ray diffraction quality could be obtained on protein crystals grown via electro-crystallization, without the need for handling of fragile capillaries or the use of hard X-rays to limit absorption from the crystallization cell.

TABLE 1

Crystallographic statistics for data obtained using graphene-based microfluidics under different applied voltages

| Parameter | 0 V | 1.2 V | 1.8 V |
|---|---|---|---|
| Data Collection | | | |
| Total # Frames | 50 | 55 | 90 |
| Resolution (Å) | 50-1.95 (1.98-1.95) | 50-1.95 (1.98-1.95) | 50-1.95 (1.98-1.95) |
| Space Group | P4₃2₁2 | P4₃2₁2 | P4₃2₁2 |
| Unit Cell (Å) | a = b = 79.35, | a = b = 79.23, | a = b = 78.92, |

TABLE 1-continued

Crystallographic statistics for data obtained using graphene-based microfluidics under different applied voltages

| Parameter | 0 V | 1.2 V | 1.8 V |
|---|---|---|---|
| | c = 37.99 | c = 38.09 | c = 38.19 |
| Single Reflections | | | |
| Total Obs. | 31,372 | 34,440 | 55,551 |
| Unique Obs. | 7,086 | 8,817 | 9,053 |
| Redundancy | 4.4 (3.4) | 3.9 (3.2) | 6.1 (5.1) |
| $R_{meas}^a$ | 0.069 (0.399) | 0.052 (0.202) | 0.076 (0.255) |
| $R_{pim}^b$ | 0.031 (0.206) | 0.025 (0.105) | 0.031 (0.112) |
| $CC_{1/2}^c$ | 0.971 (0.883) | 0.990 (0.961) | 0.951 (0.890) |
| <I/σ(I)> | 22.69 (3.39) | 33.24 (7.89) | 36.98 (9.21) |
| Completeness (%) | 76.0 (82.4) | 94.6 (95.4) | 97.5 (97.1) |

Data in the parenthesis are from the highest resolution shell.

$$^a R_{meas} = \frac{\sum_{hkl} \sqrt{\frac{n}{n-1}} \sum_{j=1}^{n} |I_{hkl,j} - \langle I_{hkl} \rangle|}{\sum_{hkl} \sum_{j} I_{hkl,j}},$$

$$^b R_{pim} = \frac{\sum_{hkl} \sqrt{\frac{1}{n-1}} \sum_{j=1}^{n} |I_{hkl,j} - \langle I_{hkl} \rangle|}{\sum_{hkl} \sum_{j} I_{hkl,j}},$$

where I is the reflection intensity and <I> is its average, $$\sqrt{\frac{n}{n-1}} \text{ and } \sqrt{\frac{1}{n-1}}$$

are factors for multiplicity. $^c CC_{1/2}$ is the Pearson correlation coefficient with dataset randomly being split in half and $$CC = \frac{\sum (x - \langle x \rangle)(y - \langle y \rangle)}{\sqrt{\sum (x - \langle x \rangle)^2 \sum (y - \langle y \rangle)^2}},$$

where x, y are single samples.

Figure 17:
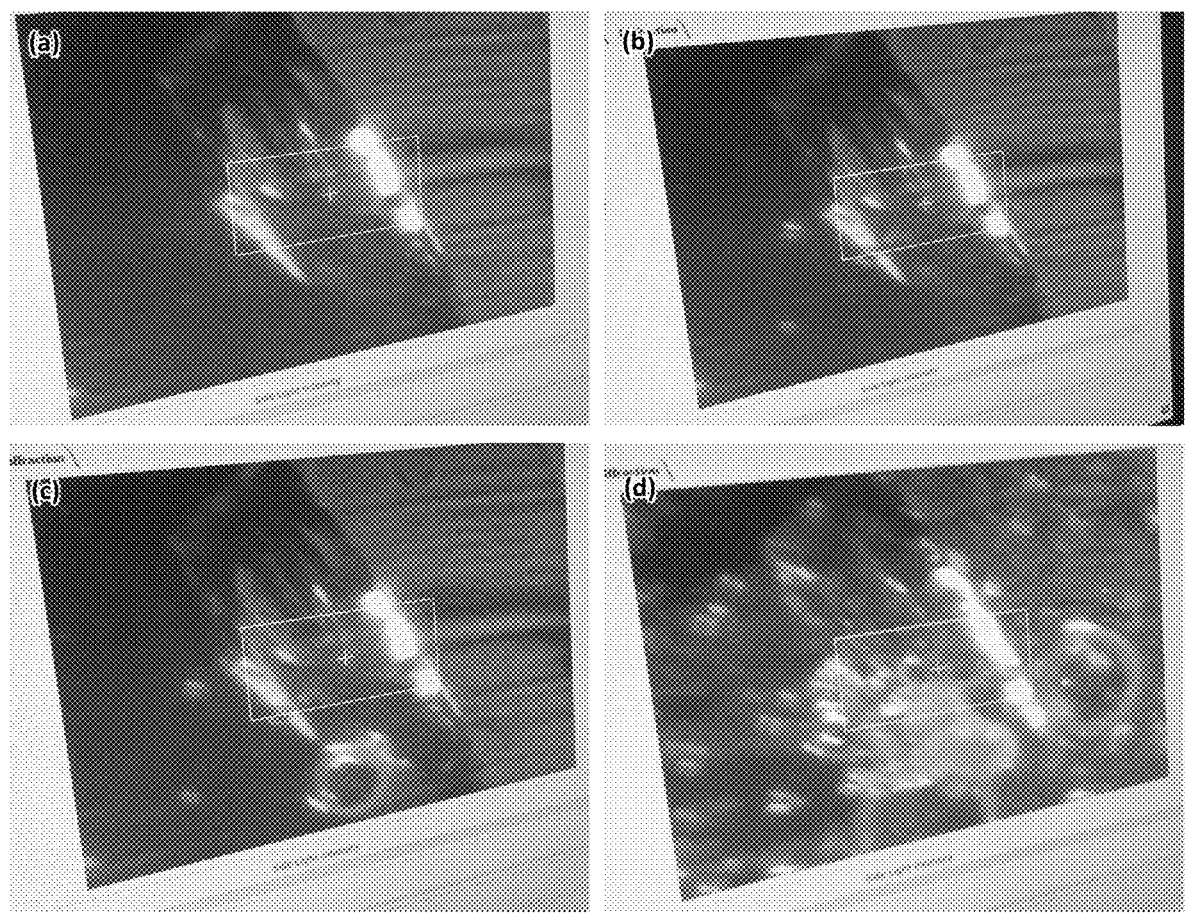
FIG. 17. Time-lapsed photographs showing the evolution of gas from a protein crystal containing sample due to the application of voltage to a device where both electrodes are in direct contact with the sample, and the subsequent electrolysis of water.
Figure 18:
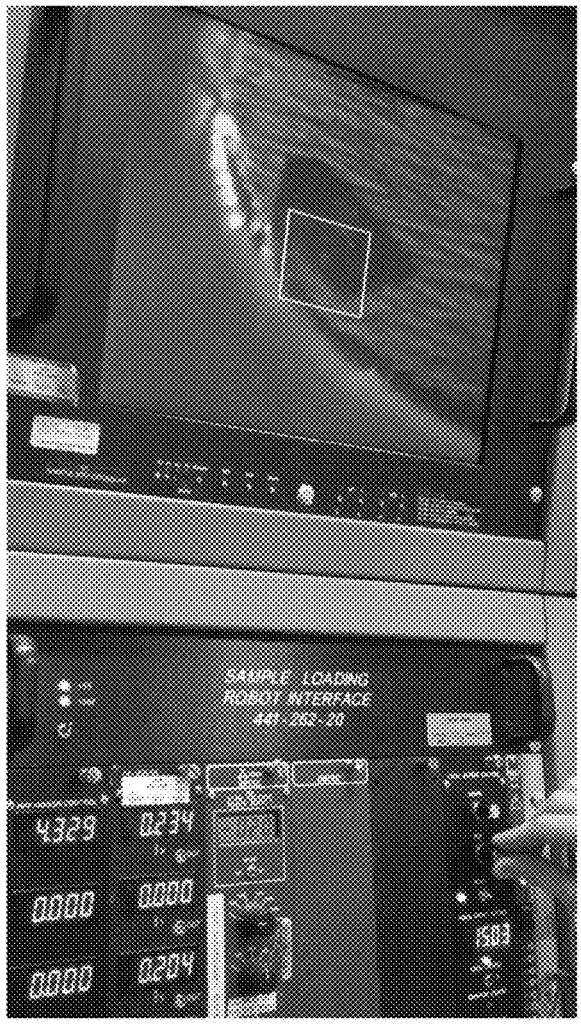
FIG. 18. Photographs protein crystals mounted in a capacitive-style device at SSRL beamline 7-1 under the influence of an applied voltage of (left) 1500 V and (right) 5000 V.
Figure 18:
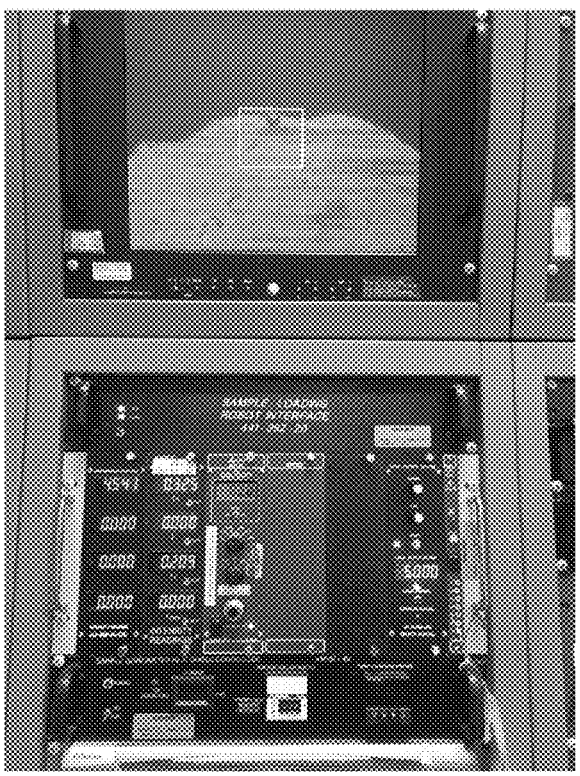
Figure 19:
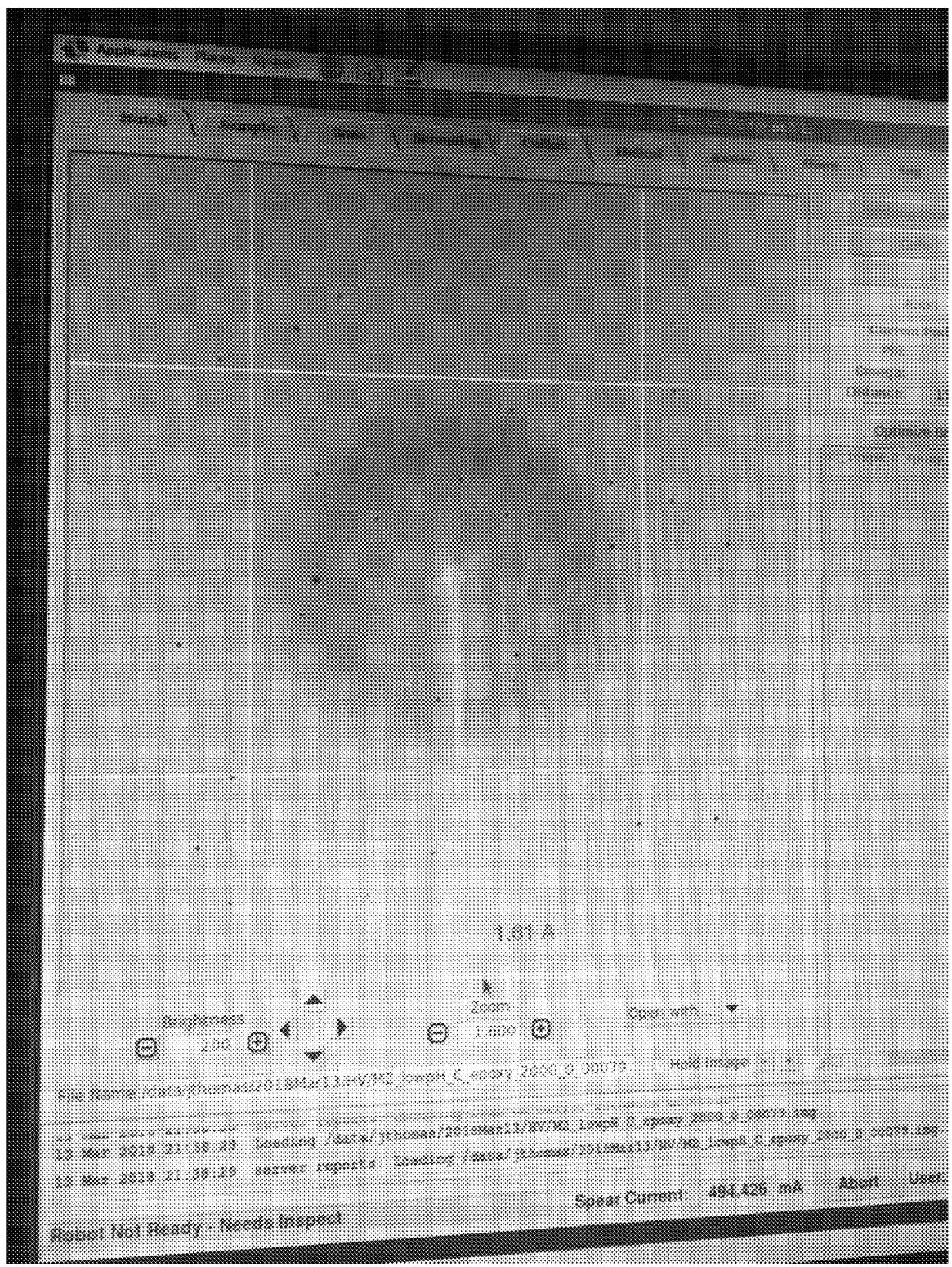
FIG. 19. Image of diffraction data obtained from a protein crystal under the influence of an electric field.

Electro-crystallography experiments were performed using three different device configurations. The first case involved direct electrode contact that allows current flow through the sample. The application of ~30V resulted in the electrolysis of water, which could be observed via the formation of bubbles within the sample chamber (FIG. 17). For the two cases involving no current path, the materials facilitated the application of extremely high electric fields. Field strengths as high as 5000 V over ~150-300 μm, or approximately 15-40 MV/m were achieved. High quality X-ray diffraction data was collected in both the presence and absence of an electric field, and data analysis is ongoing.

Applicant's disclosure is described herein in preferred embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of Applicant's disclosure may be combined in any suitable manner in one or more embodiments. In the description, herein, numerous specific details are recited to provide a thorough understanding of embodiments of the invention. One skilled in the relevant art will recognize, however, that Applicant's composition and/or method may be practiced without one or more of the specific details, or with other methods, components, materials, and so forth. In other instances, well-known structures, materials, or operations are not shown or described in detail to avoid obscuring aspects of the disclosure.

In this specification and the appended claims, the singular forms "a," "an," and "the" include plural reference, unless the context clearly dictates otherwise.

Unless defined otherwise, all technical and scientific terms used herein have the same meaning as commonly understood by one of ordinary skill in the art. Although any methods and materials similar or equivalent to those described herein can also be used in the practice or testing of the present disclosure, the preferred methods and materials are now described. Methods recited herein may be carried out in any order that is logically possible, in addition to a particular order disclosed.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples and the references to the scientific and patent literature included herein. The examples contain important additional information, exemplification and guidance that can be adapted to the practice of this invention in its various embodiments and equivalents thereof.

What is claimed is:

1. An electro-microfluidic device, comprising:
   a top layer comprising a top support layer and one or more top layers of graphene, wherein each top layer of the one or more top layers of graphene comprises an optically-clear top window area;
   a bottom layer comprising a bottom support layer and one or more bottom layers of graphene, wherein each bottom layer of the one or more bottom layers of graphene comprises an optically-clear bottom window area;
   a middle layer sandwiched between the one or more top layers of graphene and the one or more bottom layers of graphene having a patterned cavity defining a sample holding chamber;
   a cathode electrically connected to a proximal portion of the one or more top layers of graphene or the one or more bottom layers of graphene; and
   an anode electrically connected to a distal portion of the one or more top layers of graphene or the one or more bottom layers of graphene configured to allow an application of an electric field within or across the sample holding chamber;
   wherein the optically-clear top window area comprises at least a portion of the one or more top layers of graphene, and the optically-clear bottom window area comprises at least a portion of the one or more bottom layers of graphene.

2. The electro-microfluidic device of claim 1, further comprising:
   an inlet port in a fluidic communication with the sample holding chamber; and
   an outlet port in a fluidic communication with the sample holding chamber.

3. The electro-microfluidic device of claim 1, wherein the top support layer comprises a UV curable plastic material, a glass, silicon, a silicon nitride material, or a thermal plastic material.

4. The electro-microfluidic device of claim 1, wherein the bottom support layer comprises a UV curable plastic material, a glass, silicon, a silicon nitride material, or a thermal plastic material.

5. The electro-microfluidic device of claim 1, further comprising:
   an adhesive layer,
   wherein the top layer and the middle layer are joined together by the adhesive layer therebetween.

6. The electro-microfluidic device of claim 5, further comprising:
   an adhesive layer,
   wherein the bottom layer and the middle layer are joined together by the adhesive layer therebetween.

7. The electro-microfluidic device of claim 1, wherein the sample holding chamber is from 10 pL to 10 µL in volume.

8. The electro-microfluidic device of claim 1, wherein an overall thickness between the top layer and the bottom layer is from 10 µm to 1 mm.

9. The electro-microfluidic device of claim 1, wherein each of the top layer and the bottom layer comprises a single graphene film having a size from 2 $mm^2$ to 60 $cm^2$.

10. The electro-microfluidic device of claim 9, wherein the single graphene film is patterned.

11. The electro-microfluidic device of claim 1, wherein each of the top layer and the bottom layer comprises a single graphene film having a thickness from one atomic layer to 10 atomic layers.

12. The electro-microfluidic device of claim 11, wherein each of the top layer and the bottom layer comprises a graphene film of one atomic layer.

13. The electro-microfluidic device of claim 1, wherein each of the optically-clear top window area and the optically-clear bottom window area is from 100 $\mu m^2$ to 1 $cm^2$ in size.

14. The electro-microfluidic device of claim 1, wherein the one or more top layers of graphene and the one or more bottom layers of graphene serve as a vapor diffusion barrier.

15. The electro-microfluidic device of claim 1, wherein the one or more top layers of graphene and the one or more bottom layers of graphene serve as a diffusion barrier to one or more of water vapor, $O_2$, CO, $CO^2$, water, and Xe.

16. An array device comprising:
two or more electro-microfluidic devices according to claim 1.

17. A method for growing crystalline or non-crystalline materials, comprising: growing one or more crystalline or non-crystalline materials in a sample holding chamber of an electro-microfluidic device of claim 1 under a controlled application of an electric field.

18. A method of electro-crystallization and X-ray scattering analysis or X-ray diffraction analysis, comprising:
growing one or more crystalline or non-crystalline materials in a sample holding chamber of an electro-microfluidic device of claim 1, optionally under a controlled application of an electric field;
directing an X-ray beam to the one or more crystalline or non-crystalline materials via an optically-clear top window area or an optically-clear bottom window area of the electro-microfluidic device; and
measuring X-ray scattering or X-ray diffraction of the one or more crystalline or non-crystalline materials via the optically-clear bottom window area or the optically-clear top window area of the electro-microfluidic device.

19. A method for fabricating an electro-microfluidic device, comprising:
providing a first graphene film comprising one or more layers of graphene and a second graphene film comprising one or more layers of graphene;
transferring the first graphene film to a support layer forming a top layer with a window area defined by the first graphene film;
transferring the second graphene film to a support layer forming a bottom layer with a window area defined by the second graphene film;
forming an electro-microfluidic device by bonding a middle layer having a pattern to and between the top layer and the bottom layer to form a sandwiched construct having:
a cavity for holding a sample defined by the top layer and bottom layer and the pattern of the middle layer, and
a first channel and a second channel connecting to the second graphene film at a proximal location and a distal location; and
providing a conductive material to the first channel and second channel so as to form an electric connectivity to the second graphene film.

20. A device comprising:
an electro-microfluidic device fabricated by the method of claim 19.

* * * * *